(12) United States Patent
Kang et al.

(10) Patent No.: US 10,804,195 B2
(45) Date of Patent: Oct. 13, 2020

(54) HIGH DENSITY EMBEDDED INTERCONNECTS IN SUBSTRATE

(71) Applicant: QUALCOMM Incorporated, San Diego, CA (US)

(72) Inventors: Kuiwon Kang, San Diego, CA (US); Marcus Hsu, San Diego, CA (US); Brigham Navaja, San Diego, CA (US); Houssam Jomaa, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 54 days.

(21) Appl. No.: 16/230,896

(22) Filed: Dec. 21, 2018

(65) Prior Publication Data

US 2020/0051907 A1 Feb. 13, 2020

Related U.S. Application Data

(60) Provisional application No. 62/716,196, filed on Aug. 8, 2018.

(51) Int. Cl.
| | |
|---|---|
| *H01L 23/522* | (2006.01) |
| *H01L 23/00* | (2006.01) |
| *H01L 21/768* | (2006.01) |
| *H01L 23/528* | (2006.01) |

(52) U.S. Cl.
CPC .... *H01L 23/5226* (2013.01); *H01L 21/76802* (2013.01); *H01L 23/5283* (2013.01); *H01L 24/17* (2013.01); *H01L 24/25* (2013.01)

(58) Field of Classification Search
CPC .................................................. H01L 23/5226
USPC ................................................................ 257/774
See application file for complete search history.

(56) References Cited

U.S. PATENT DOCUMENTS

| | | | | |
|---|---|---|---|---|
| 5,107,428 | A * | 4/1992 | Bethencourt | G07C 5/0808 701/29.2 |
| 8,199,518 | B1* | 6/2012 | Chun | H01L 23/3128 361/767 |
| 9,633,977 | B1* | 4/2017 | We | H01L 25/0655 |
| 2009/0302477 | A1* | 12/2009 | Shor | H01L 21/76843 257/773 |
| 2010/0117080 | A1* | 5/2010 | Chen | H01L 22/34 257/48 |
| 2011/0089439 | A1* | 4/2011 | Cummins | G01N 27/223 257/84 |
| 2012/0228754 | A1* | 9/2012 | Liu | H01L 25/0657 257/676 |
| 2013/0214296 | A1* | 8/2013 | Mohammed | H01L 23/142 257/88 |
| 2013/0244490 | A1* | 9/2013 | Rathburn | H05K 3/326 439/628 |

(Continued)

*Primary Examiner* — Jami Valentine Miller
(74) *Attorney, Agent, or Firm* — Qualcomm Incorporated

(57) ABSTRACT

A device that includes a die and a substrate coupled to the die. The substrate includes a dielectric layer and a plurality of embedded interconnects. Each embedded interconnect located through a first planar surface of the substrate such that a first portion of the embedded interconnect is located within the dielectric layer and a second portion of the embedded interconnect is external of the dielectric layer. In some implementations, the substrate includes a core layer. In some implementations, the dielectric layer and the plurality of embedded interconnects may be part of a build up layer of the substrate.

24 Claims, 27 Drawing Sheets

(56) References Cited

U.S. PATENT DOCUMENTS

| | | | | |
|---|---|---|---|---|
| 2014/0117552 | A1* | 5/2014 | Qian | H01L 23/5381 |
| | | | | 257/762 |
| 2018/0301405 | A1* | 10/2018 | Sankman | H01L 23/5383 |
| 2020/0006241 | A1* | 1/2020 | Wu | H01L 21/56 |

* cited by examiner

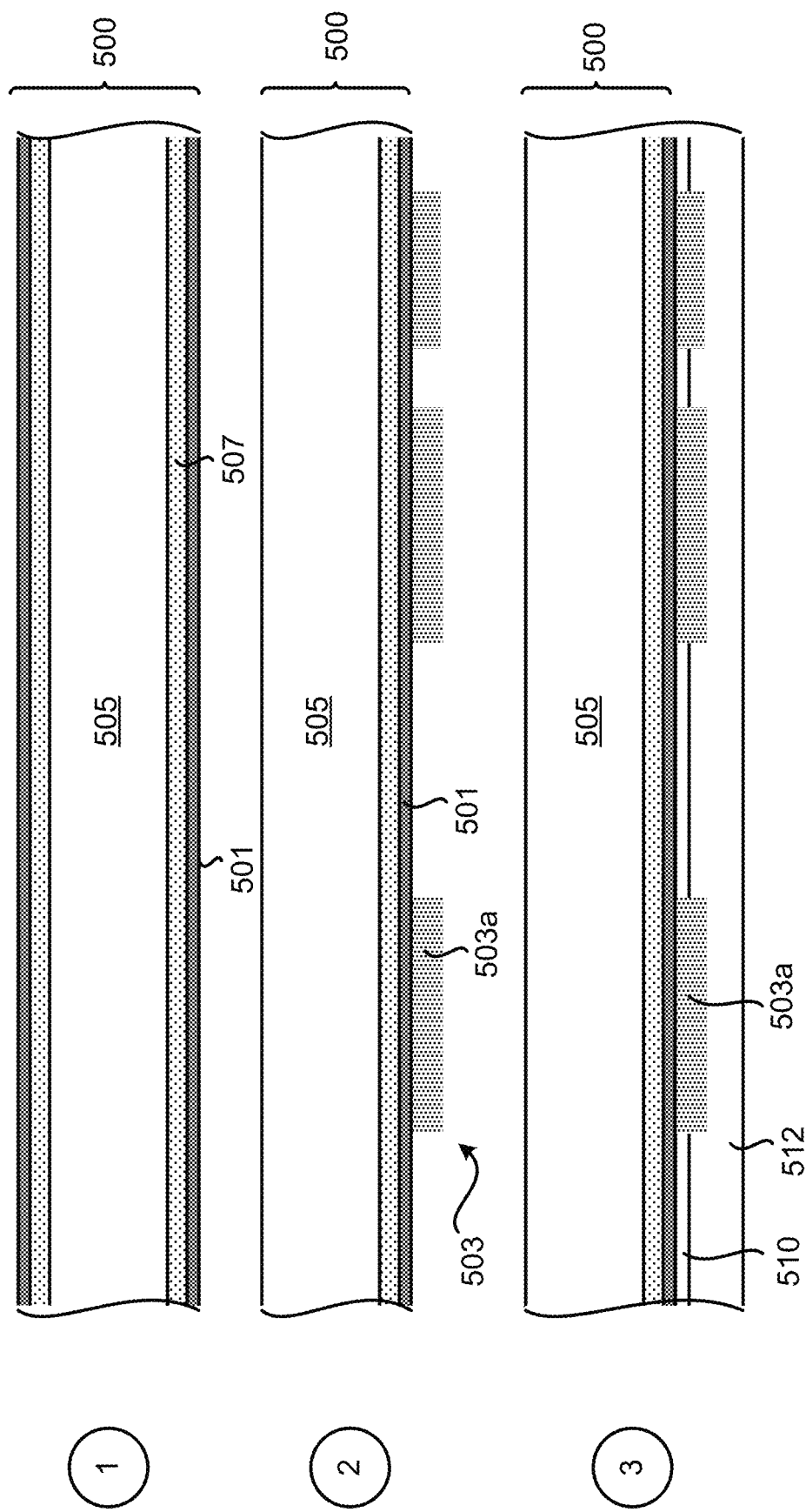

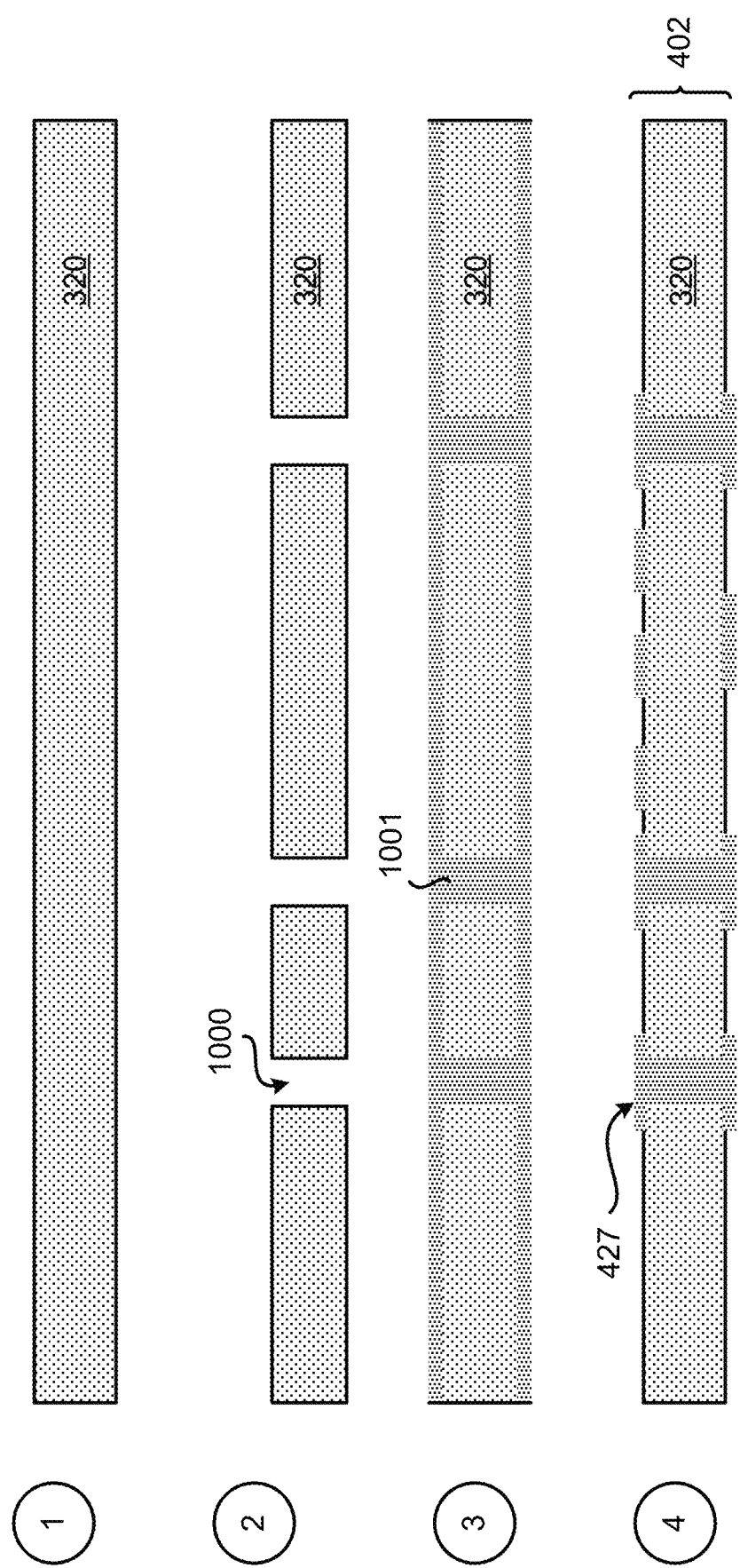

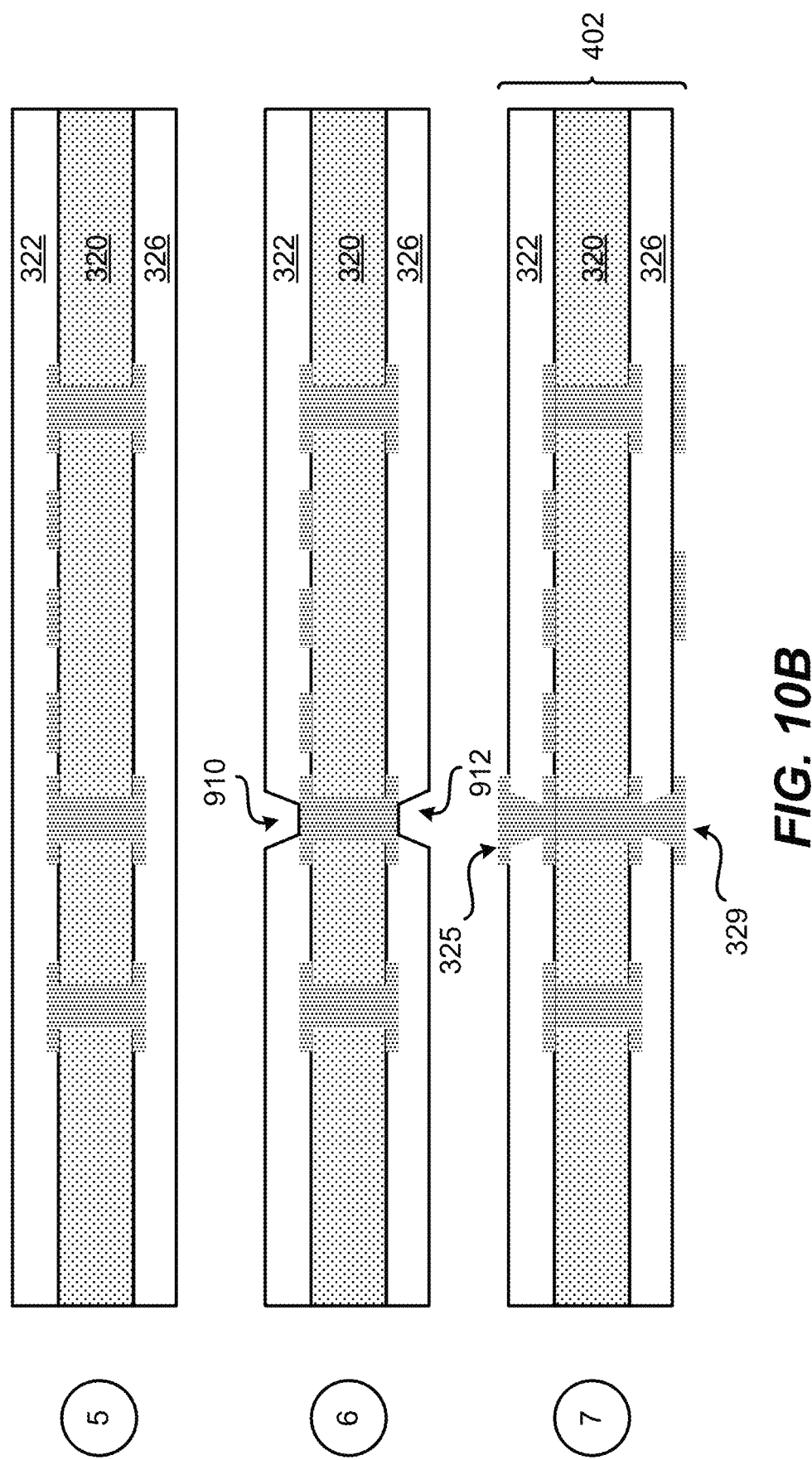

HIGH DENSITY EMBEDDED INTERCONNECTS IN SUBSTRATE

CROSS-REFERENCE TO RELATED APPLICATION(S)

This application claims priority to and the benefit of Provisional Application No. 62/716,196, filed in the U.S. Patent and Trademark Office on Aug. 8, 2018, the entire contents of which is incorporated herein by reference as if fully set forth below in their entirety and for all applicable purpose.

BACKGROUND

Field

Various features relate to substrates for integrated devices, but more specifically to high density embedded interconnects in substrates.

Background

FIG. 1 illustrates an integrated device 100 that includes a substrate 102 and a die 104. The die 104 is coupled to the substrate 102 through a plurality of solder interconnects 140, which may include bumps and solder. The integrated device 100 is designed to be used in small portable devices, such as mobile devices.

The substrate 102 includes a plurality of dielectric layers 120, a plurality of interconnects 122, and a plurality of embedded interconnects 123. Each layer of the dielectric layers 120 includes a patterned metal layer and vias. The substrate 102 includes a first solder resist layer 124, a second solder resist layer 126, and a plurality of solder interconnects 130. The substrate 102 is a coreless substrate.

The plurality of embedded interconnects 123 are fully embedded in the dielectric layers 120. The plurality of embedded interconnects 123 is recessed in the dielectric layers 120. Thus, the surface of the embedded interconnects 123 are not planar with a first surface of the dielectric layers 120.

There are a few drawbacks to the above design. One, the recess of the embedded interconnects 123 from the surface can cause filler material, such as non-conductive paste (which is a material from underfills used for die to substrate bond connection), to flow into the recess and between the embedded interconnects 123 and the plurality of solder interconnects 140. This can cause weak joints and/or open joints where no electrical current can pass through. Two, the recess of the embedded interconnects 123 means that the line and spacing (L/S) of the embedded interconnects is limited by peeling and lift off issues as the line and spacing dimensions get smaller and smaller.

Therefore, there is a need for providing a device that can provide smaller line and spacing (L/S) for embedded interconnects. Ideally, such a device may provide interconnects with more reliable joints between electrical connections.

SUMMARY

Various features relate to substrates for integrated devices, but more specifically to high density embedded interconnects in substrates.

One example provides a device that includes a die and a substrate coupled to the die. The substrate includes a dielectric layer and a plurality of embedded interconnects. Each embedded interconnect located through a first planar surface of the substrate such that a first portion of the embedded interconnect is located within the dielectric layer and a second portion of the embedded interconnect is external of the dielectric layer.

Another example provides a substrate that includes a dielectric layer and a plurality of embedded interconnects. Each embedded interconnect located through a first planar surface of the substrate such that a first portion of the embedded interconnect is located within the dielectric layer and a second portion of the embedded interconnect is external of the dielectric layer.

Another example provides a method for fabricating a substrate. The method forms a dielectric layer. The method forms a plurality of embedded interconnects in the dielectric layer. Each embedded interconnect is formed through a first planar surface of the substrate such that a first portion of the embedded interconnect is located within the dielectric layer and a second portion of the embedded interconnect is external of the dielectric layer.

BRIEF DESCRIPTION OF THE DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

Figure 1:
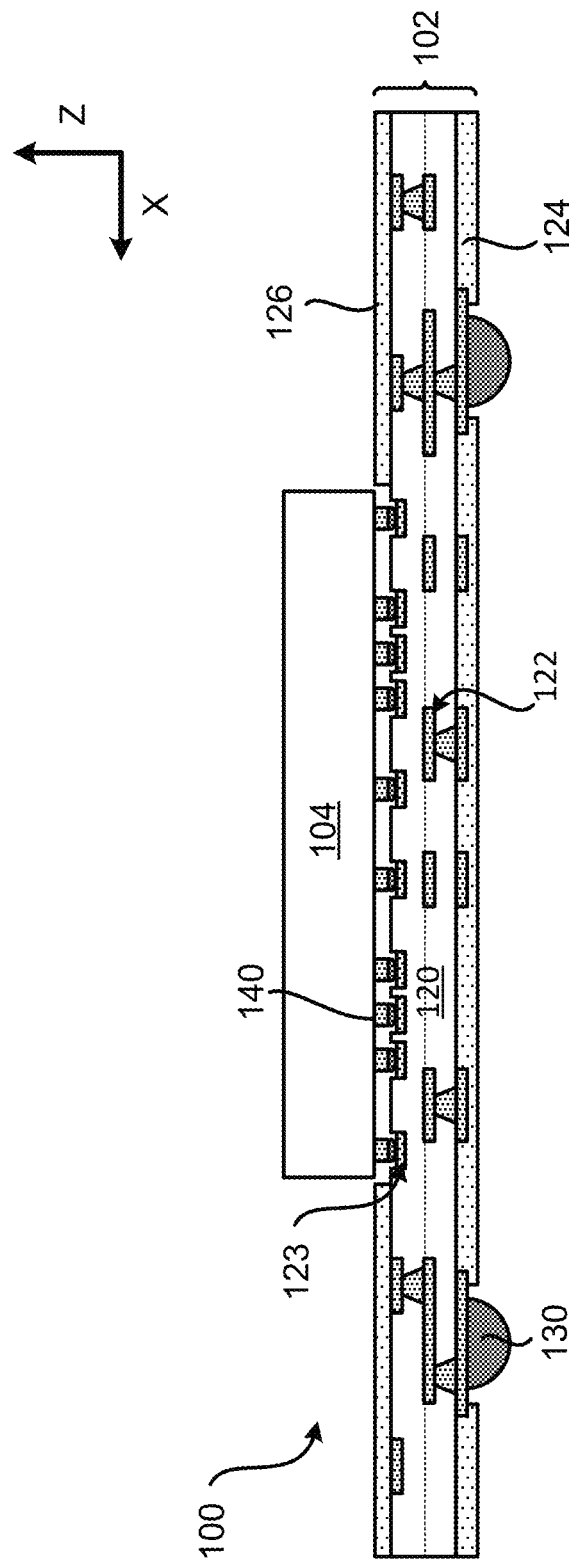
FIG. 1 illustrates a profile view of a device that includes a die and a substrate.
Figure 2:
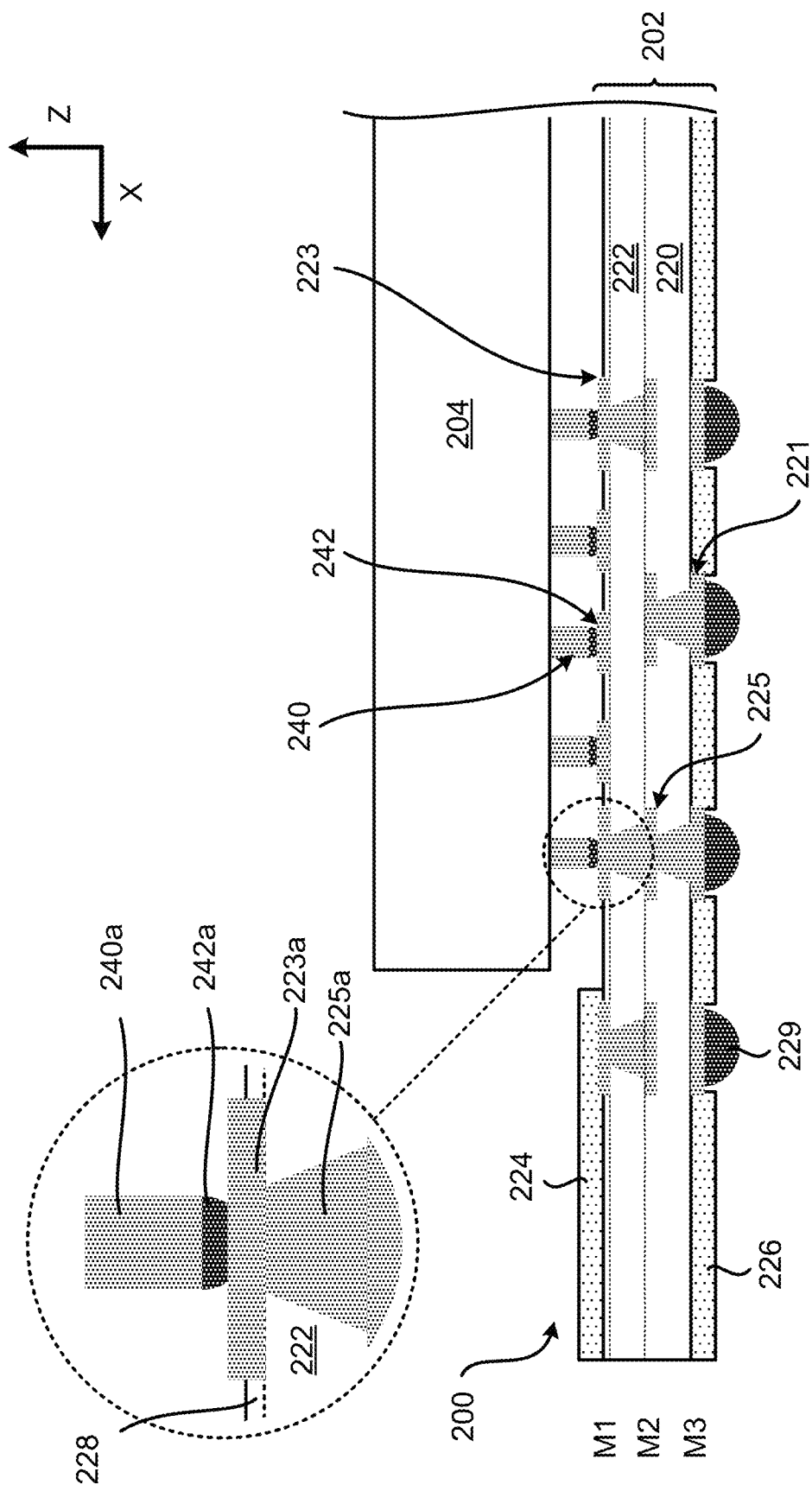
FIG. 2 illustrates a profile view of a package that includes a die and a coreless substrate with embedded surface interconnects.

The present disclosure describes a device that includes a die and a substrate coupled to the die. The substrate includes a dielectric layer and a plurality of embedded interconnects. Each embedded interconnect (e.g., embedded surface interconnect) located through a first planar surface of the substrate such that a first portion of the embedded interconnect is located within the dielectric layer and a second portion of the embedded interconnect is external of the dielectric layer.
Exemplary Device Comprising Substrate with Embedded Interconnects FIG. 2 illustrates a profile view of a device 200 that includes a substrate 202 and a die 204. The device 200 may be an integrated device and/or an integrated package (e.g. integrated circuit (IC) package). The die 204 may include high density bump interconnects.

The substrate 202 includes a dielectric layer 220, a dielectric layer 222, a first solder resist layer 224, a second solder resist layer 226, a plurality of interconnects 221, a plurality of interconnects 225, and a plurality of embedded interconnects 223. The substrate 202 may be a coreless substrate, such an embedded trace substrate (ETS). The substrate 202 may also include a dielectric layer 228 that is formed over the dielectric layer 222. In some implementations, the dielectric layer 228 is a separate dielectric layer from the dielectric layer 222. However, the dielectric layer 228 may be made of the same material as the dielectric layer 222. In some implementations, the dielectric layers 220, 222 and 228 may be considered as a single dielectric layer. The dielectric layer 220, 222 and 228 may be made of the same or different material. The materials for the dielectric layer 220, 222, 228 may include dry film, such as a multi-functional filled epoxy and/or prepreg (PPG). The PPG may include glass fibers with resin.

The plurality of embedded interconnects 223 (e.g., embedded surface interconnects) may include embedded traces (e.g., embedded surface traces) and/or embedded pads (e.g., embedded surface pads). The plurality of embedded interconnects 223 is partially embedded through a first planar surface (e.g., surface facing the die 204) of the substrate 202. In some implementations, the plurality of embedded interconnects 223 (e.g., means for embedded surface electrical connection) are embedded surface interconnects of the substrate 202. In some implementations, a partially embedded interconnect is an interconnect that is partially located in a dielectric layer and partially external of a dielectric layer. In some implementations, an embedded interconnect travels and/or is located through a first planar surface of the substrate such that a first portion of the embedded interconnect is located within a dielectric layer and a second portion of the embedded interconnect is external of the dielectric layer. The first portion and the second portion of the embedded interconnect may have approximately the same planar cross section. In some implementations, a thickness of the first portion of the embedded interconnect is in a range of about 50-100 percent (e.g., 50-99 percent) of the total thickness of the embedded interconnect, and a thickness of the second portion of the embedded interconnect is in a range of about 0-50 percent (e.g., 1-50 percent) of the total thickness of the embedded interconnect.

As shown in FIG. 2, the embedded interconnect 223a (e.g., embedded surface interconnect) is partially embedded in the dielectric layer 228, leaving portions of the embedded interconnect 223a free of a dielectric layer. Thus, a first portion of the embedded interconnect 223a is below a first planar surface of the substrate 202 (e.g., first planar surface of the dielectric layer 228), and a second portion of the embedded interconnect 223a is above the first planar surface of the substrate 202. In some implementations, a first portion of the embedded interconnect 223a is embedded through a first planar surface of the substrate 202 (e.g., first planar surface of the dielectric layer 228), and a second portion of the embedded interconnect 223a is protruding from the dielectric layer 228 and through the first planar surface of the substrate 202. The embedded interconnect 223a may be made of a contiguous interconnect. In some implementations, the first portion of the embedded interconnects (e.g., 223a) has a first planar cross section that is approximately the same as a second planar cross section of the second portion of the embedded interconnects (e.g., 223a). In some implementations, a planar cross section may be a cross section that travels along an X and/or Y direction.

The die 204 is coupled to the substrate 202 through a plurality of bump interconnects 240 and a plurality of solder interconnects 242. For example, the die 204 may include bump interconnect 240a and solder interconnect 242a. The bump interconnect 240a is coupled to the solder interconnect 242a. The solder interconnect 242a is coupled to the embedded interconnect 223a (e.g., embedded pad). The embedded interconnect 223a is coupled to the interconnect 225a (e.g., via).

There are several technical advantages to the configuration of FIG. 2. One, the use of embedded interconnects (e.g., embedded surface interconnects) reduces the likelihood of filler being located between the embedded interconnects and the bump interconnects and solder interconnects. Two, the use of embedded interconnects provides finer pitch and finer spacing of interconnects that are coupled to the bump interconnects and solder interconnects of a die. This results in higher density interconnects for the substrate. In some implementations, each embedded interconnect from the plurality of embedded interconnects 223 has a minimum width of 5 micrometers (μm), and a minimum spacing between embedded interconnects of 5 micrometers (μm). The above line and space (L/S) dimensions are possible because of a fabrication process that reduces peeling and interconnect lift off issues (due to the fact that the interconnect is protected by dielectric material on several surfaces (e.g., 3 surfaces)). The plurality of embedded interconnects may have a minimum pitch of about 65 micrometers (μm). Similarly, the plurality of bump interconnects 240 may have a minimum pitch of about 65 micrometers (μm).

FIG. 2 illustrates that the plurality of interconnects 225 include vias that are tapered, where one side of the via is wider than another side of the via. The tapered vias are located in the dielectric layer (e.g., 220, 222) such that the side of the tapered via that is narrower is facing the die 204. It is noted that the vias described in the disclosure may be tapered or have vertical walls, depending on the drilling type and the thickness of the dielectric layer. For example, the interconnect 225a may be a tapered via that includes a first portion with a first width (e.g., first diameter) and a second portion with a second width (e.g., second diameter), where the first portion of the interconnect 225a faces the die 204. In some implementations, the second portion with the second width of the interconnect 225a may face the die 204.

The plurality of interconnects 221 is located over a planar surface of the substrate 202 (e.g., located over a planar surface of the dielectric layer 220). However, in some implementations, the plurality of interconnects 221 may be implemented through a second surface of the substrate 202 as embedded interconnects (e.g., embedded surface interconnects) in a similar manner as the plurality of embedded interconnects 223.

FIG. 2 illustrates a substrate with several metal layers (e.g., M1, M2, M3). The labeling of the metal layers of the substrate is exemplary. Different implementations may label the metal layers differently. For example, the metal layers may be labeled as M1, M2 and M3 from bottom to top. In some implementations, the M1 and M3 metal layers are considered as a top metal layer and a bottom metal layer, respectively, of the substrate. In some implementations, the M1 and M3 metal layers may be considered the first and last metal layers, respectively, of the substrate. The intermediate metal layer or middle metal layer may be M2. If there are N metal layers in a substrate, where N is greater than 2, then M1 and N may be the top and bottom metal layers, or vice versa, and the metal layer(s) between M1 and N are the middle metal layers and/or intermediate metal layers of the substrate. Interconnects that are formed in the top and/or bottom metal layers of a substrate may be considered surface interconnects (e.g., embedded surface interconnects) of the substrate.

Examples of fabricating the device 200 that includes a substrate with embedded interconnects are further illustrated and described in at least FIGS. 5A-5B and 6A-6C.

Exemplary Device Comprising Substrate with Embedded Interconnects

Figure 3:
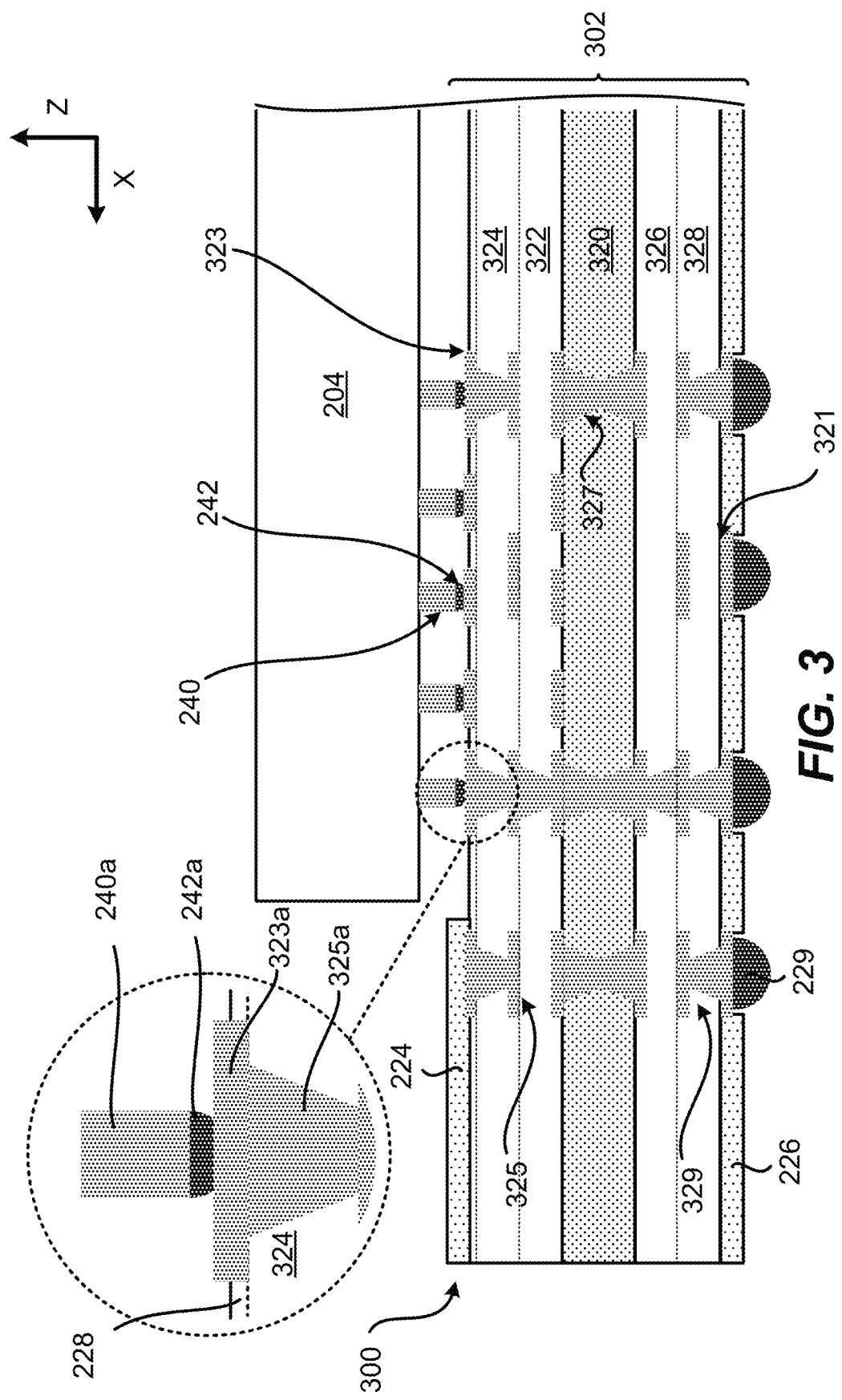
FIG. 3 illustrates a profile view of a package that includes a die and a core substrate with embedded surface interconnects.

FIG. 3 illustrates a profile view of a device 300 that includes a substrate 302 and the die 204. The device 300 may be an integrated device and/or an integrated package (e.g. integrated circuit (IC) package).

The substrate 302 includes a core layer 320, a dielectric layer 322, a dielectric layer 324, a dielectric layer 326, a dielectric layer 328, the first solder resist layer 224, the second solder resist layer 226, a plurality of interconnects 321, a plurality of interconnects 325, a plurality of interconnects 327, a plurality of interconnects 329, and a plurality of embedded interconnects 323. The plurality of embedded interconnects 323 is coupled to the plurality of interconnects 325. The plurality of interconnects 325 is coupled to the plurality of interconnects 327. The plurality of interconnects 327 is coupled to the plurality of interconnects 329. The plurality of interconnects 329 is coupled to the plurality of interconnects 321. The substrate 302 may be a core substrate. The substrate 302 may also include a dielectric layer 228 that is formed over the dielectric layer 324. In some implementations, the dielectric layer 228 is a separate dielectric layer from the dielectric layer 324. However, the dielectric layer 228 and the dielectric layer 324 may be made of the same material. The materials for the dielectric layer(s) (e.g., 228, 322, 324, 326, 328) may include dry film, such as a multi-functional filled epoxy and/or prepreg (PPG). In some implementations, due to the thickness of the dielectric layer 228, the dielectric layer 228 is a multi-functional epoxy filled with inorganic filler. The PPG may include glass fibers with resin. The core layer 320 may include different dielectric materials, such a silicon, glass, quartz, epoxy, or combinations thereof. The core layer is an example of a dielectric layer.

The plurality of embedded interconnects 323 (e.g., embedded surface interconnects) may include embedded traces (e.g., embedded surface traces) and/or embedded pads (e.g., embedded surface pads). The plurality of embedded interconnects 323 is partially embedded through a first planar surface (e.g., surface facing the die 204) of the substrate 302. In some implementations, the plurality of embedded interconnects 323 are embedded surface interconnects of the substrate 302. In some implementations, a partially embedded interconnect is an interconnect that is partially located in a dielectric layer; and partially external of a dielectric layer. In some implementations, an embedded interconnect (e.g., 323a) travels and/or is located through a first planar surface of the substrate such that a first portion of the embedded interconnect (e.g., 323a) is located within a dielectric layer and a second portion of the embedded interconnect (e.g., 323a) is external of a dielectric layer. In some implementations, the first portion of the embedded interconnects (e.g., 323a) has a first planar cross section that is approximately the same as a second planar cross section of the second portion of the embedded interconnects (e.g., 323a). In some implementations, a thickness of the first portion of the embedded interconnect is in a range of about 50-100 percent (e.g., 50-99 percent) of the total thickness of the embedded interconnect, and a thickness of the second portion of the embedded interconnect is in a range of about 0-50 percent (e.g., 1-50 percent) of the total thickness of the embedded interconnect.

As shown in FIG. 3, the embedded interconnect 323a is partially embedded in the dielectric layer 228, leaving portions of the embedded interconnect 323a free of a dielectric layer. Thus, a first portion of the embedded interconnect 323a is below a first planar surface of the substrate 302 (e.g., first planar surface of the dielectric layer 228), and a second portion of the embedded interconnect 323a is above the first planar surface of the substrate 302. The embedded interconnect 323a may be made of a contiguous interconnect.

FIG. 3 illustrates that the plurality of embedded interconnects 323 as being embedded interconnects. However, other interconnects of the substrate 302 may be embedded interconnects, such as interconnects of any of the metal layers (e.g., M1, M2, M3, M4) of the substrate 302. Moreover, different implementations of the substrate 302 may have different numbers of dielectric layers and/or different numbers of metal layers. A dielectric layer may be referred as a build up layer. Thus, different implementations of the substrate 302 may have different numbers of build up layers. In some implementations, interconnects formed within and/or on the dielectric layer may be considered part of the build layer.

The die 204 is coupled to the substrate 302 through a plurality of bump interconnects 240 and a plurality of solder interconnects 242. For example, the die 204 may include bump interconnect 240a and solder interconnect 242a. The bump interconnect 240a is coupled to the solder interconnect 242a. The solder interconnect 242a is coupled to the embedded interconnect 323a (e.g., embedded pad). The embedded interconnect 323a is coupled to the interconnect 325a (e.g., via). The walls of the vias are angled or nonvertical relative to the first surface and the second surface of the core layer 320. As mentioned above, the vias may have vertical walls or tapered walls depending on the process used to fabricate the holes and/or cavities.

There are several technical advantages to the configuration of FIG. 3. One, the embedded interconnects (e.g., traces) are protected from several sides and exposed on the top, allowing embedded interconnects width reduction in an open solder resist (SR) trench under die without risk of peel off. For example, the use of embedded interconnects provides finer pitch and finer spacing of interconnects that are coupled to the bump interconnects and solder interconnects of a die. This results in higher density interconnects for the substrate. In some implementations, each embedded interconnect from the plurality of embedded interconnects 323 has a minimum width of 5 micrometers (μm), and a minimum spacing, between embedded interconnects, of 5 micrometers (μm). The above line and space (L/S) dimensions are possible because of a fabrication process that reduces peeling and interconnect lift off issues. The plurality of embedded interconnects may have a minimum pitch of about 65 micrometers (μm). Similarly, the plurality of bump interconnects 240 may have a minimum pitch of about 65 micrometers (μm). In some implementations, the minimum width of an embedded interconnects (e.g., embedded trace) is 15 micrometers (μm).

Figure 4:
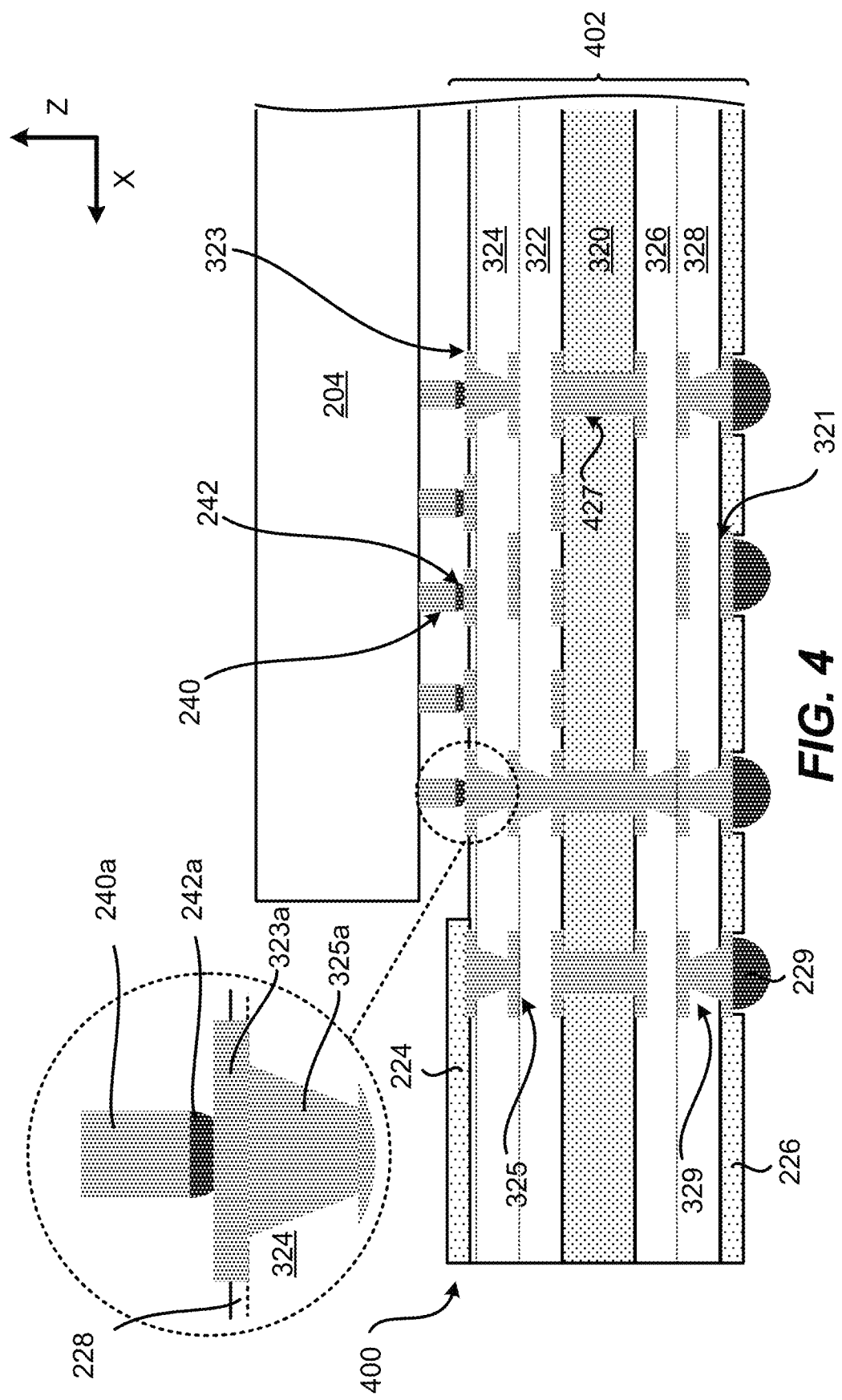
FIG. 4 illustrates a profile view of a package that includes a die and a core substrate with embedded surface interconnects.

FIG. 4 illustrates a profile view of a device 400 that includes a substrate 402 and the die 204. The device 400 may be an integrated device and/or an integrated package (e.g. integrated circuit (IC) package).

The substrate 402 includes the core layer 320, the first solder resist layer 224, the second solder resist layer 226, the plurality of interconnects 421, a plurality of interconnects 325, a plurality of interconnects 329, a plurality of interconnects 427, and a plurality of embedded interconnects 323. The plurality of embedded interconnects 323 is coupled to the plurality of interconnects 325. The plurality of interconnects 325 is coupled to the plurality of interconnects 427. The plurality of interconnects 427 is coupled to the plurality of interconnects 329. The plurality of interconnects 329 is coupled to the plurality of interconnects 321. The substrate 402 may be a core substrate. The substrate 302 may also include a dielectric layer 228 that is formed over the dielectric layer 324. The materials for the dielectric layer(s) (e.g., 228, 322, 324, 326, 328) may include dry film, such as Ajinomoto build-up film (ABF) and/or prepreg (PPG). The PPG may include glass fibers with resin. The core layer 320 may include different dielectric materials, such a silicon, glass, quartz, epoxy, or combinations thereof. The core layer is an example of a dielectric layer.

The substrate 402 of FIG. 4 is similar to the substrate 302 of FIG. 3. However, the core layer 320 includes vias (e.g., interconnect 427) that have walls that are approximately vertical to a first surface and/or a second surface of the core layer 320. In some implementations, the vias (e.g., interconnect 427) of the core layer 320 in FIG. 4 are fabricated by using a mechanical drilling process, while the vias (e.g., interconnect 327) of the core layer 320 in FIG. 3 are fabricated by using a laser process.

FIG. 4 illustrates that the plurality of embedded interconnects 323 as being embedded interconnects. However, other interconnects of the substrate 402 may be embedded interconnects, such as interconnects of any of the metal layers (e.g., M1, M2, M3, M4) of the substrate 402. Moreover, different implementations of the substrate 402 may have different numbers of dielectric layers and/or different numbers of metal layers. A dielectric layer may be referred as a build up layer. Thus, different implementations of the substrate 402 may have different numbers of build up layers. In some implementations, interconnects formed within and/or on the dielectric layer may be considered part of the build layer.

Examples of fabricating the devices 300 and/or 400 that include a substrate with embedded interconnects are further illustrated and described below in at least FIGS. 8, 9A-9F and 10A-10F.

Figure 5B:
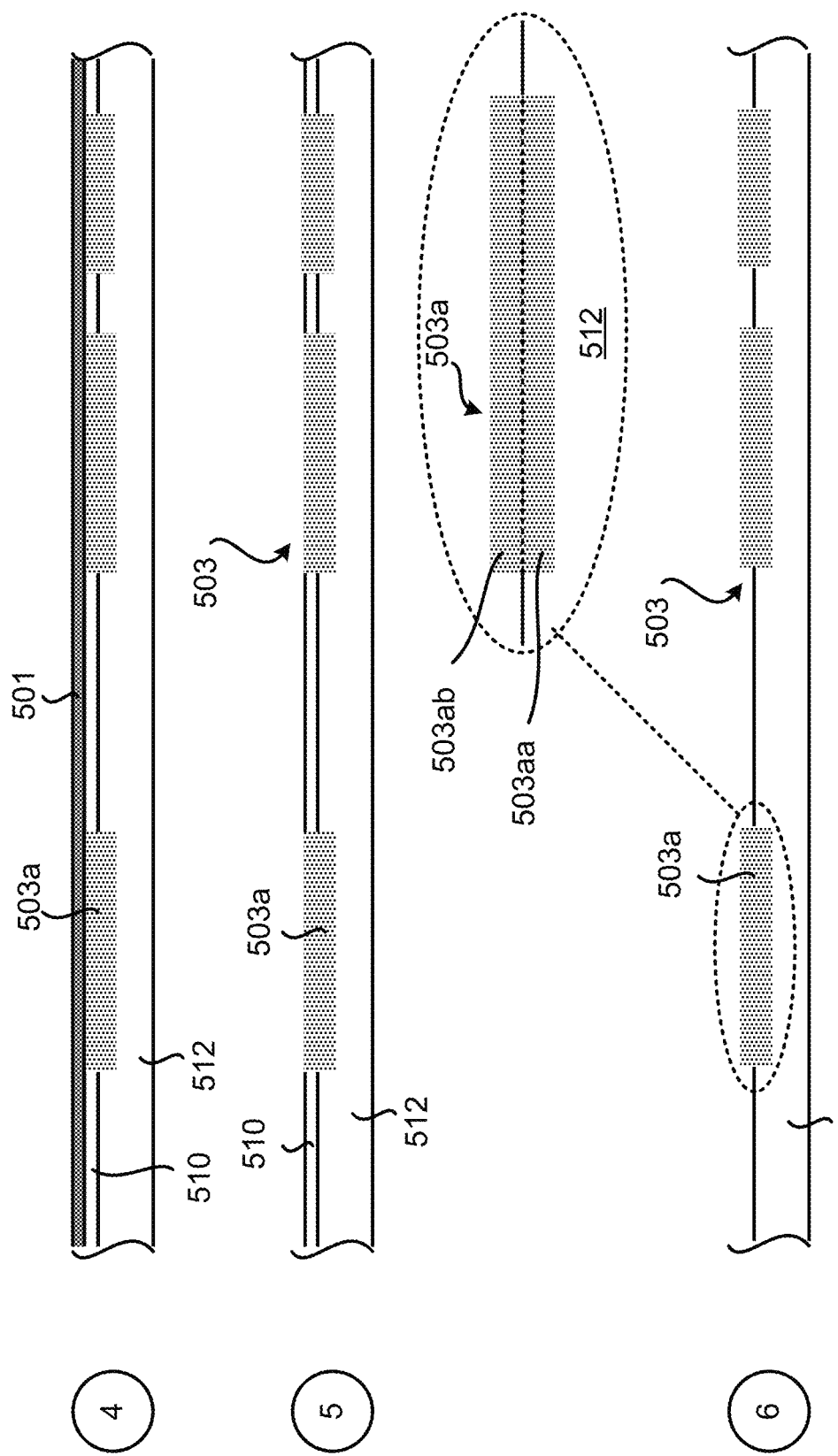
FIG. 5 (comprising FIGS. 5A-5B) illustrates an exemplary sequence for fabricating embedded interconnects in a coreless substrate.

Exemplary Sequence for Fabricating Embedded Interconnects in a Coreless Substrate FIG. 5 (which includes FIGS. 5A-5B) illustrates an exemplary sequence for providing or fabricating embedded interconnects in a coreless substrate. In some implementations, the sequence of FIGS. 5A-5B may be used to provide or fabricate the embedded interconnects (e.g., 223) of FIG. 2.

It should be noted that the sequence of FIGS. 5A-5B may combine one or more stages in order to simplify and/or clarify the sequence for providing or fabricating embedded interconnects in a substrate. In some implementations, the order of the processes may be changed or modified. In some implementations, one or more of processes may be replaced or substituted without departing from the spirit of the disclosure. In some implementations, the sequence of FIG. 5 may be used with an embedded trace substrate (ETS) fabrication process.

Stage 1, as shown in FIG. 5A, illustrates a state after a carrier 500 is provided. The carrier 500 may include a core layer 505, a copper foil layer 507, and a copper seed layer 501. The carrier 500 may include several foil layers and/or seed layers. For example, the carrier may include a first seed layer on a first surface of the carrier 500, and a second seed layer on a second surface of the carrier 500. The seed layer 501 may be a foil (e.g., copper foil). The foil layer 507 may be similar to the seed layer 501. In some implementations, the foil layer 507 can be peeled off by mechanical separation. The core layer 505 may include copper clad laminate (CCL) with the foil layer 507. Different implementations may have different dimensions for the carrier 500. In some implementations, the core layer 505 may have a thickness in a range of about 60-200 micrometers (μm). In some implementations, the foil layer 507 may have a thickness of about 18 micrometers (μm). In some implementations, the seed layer 501 may have a thickness in a range of about 3-5 micrometers (μm).

Stage 2 illustrates a state after a plurality of interconnects 503 (e.g., 503a) is formed over the seed layer 501. A plating process may be used to form the interconnects 503 over the seed layer 501. In some implementations, forming the interconnects may include providing a patterned metal layer over and/or in the seed layer 501.

Stage 3 illustrates a state after a first dielectric layer 510 and a second dielectric layer 512 are formed over the seed layer 501 and the plurality of interconnects 503. The first dielectric layer 510 may be a de-smear soluble dielectric layer. The first dielectric layer 510 may more selectively soluble in oxidizing and chemistries, relative to the second dielectric layer 512. A lamination process may be used to form the first dielectric layer 510 and the second dielectric layer 512. In some implementations, the first dielectric layer 510 and the second dielectric layer 512 are made of different materials. The materials for the first dielectric layer 510 and/or the second dielectric layer 512 may include dry film, such as a multi-functional filled epoxy and/or prepreg (PPG). The PPG may include glass fibers with resin.

Stage 4, as shown in FIG. 5B, illustrates a state after part of the carrier 500 is decoupled (e.g., separated) from the seed layer 501, the first dielectric layer 510 and the plurality of interconnects 503. For example, the core layer 505 and the foil layer 507 are decoupled from the seed layer 501. A mechanical separation process may be used to decouple the core layer 505 and the foil layer 507 from the seed layer 501.

Stage 5 illustrates a state after the seed layer 501 has been removed from the first dielectric layer 510. The seed layer 501 may be removed through an etching process.

Stage 6 illustrates a state after the first dielectric layer 510 has been removed, leaving the plurality of interconnects 503 as embedded interconnects in the second dielectric layer 512. The first dielectric layer 510 may be removed through a chemical etching process. As shown in stage 6, the plurality of interconnects 503 are embedded in the second dielectric layer 512 in a way that an embedded interconnect travels and/or is located through a first planar surface of the substrate such that a first portion (e.g., 503aa) of the embedded interconnect (e.g., 503a) is located within the dielectric layer 512 and a second portion (e.g., 503ab) of the embedded interconnect (e.g., 503ab) is external of the dielectric layer 512. In some implementations, a thickness of the first portion of the embedded interconnect is in a range of about 50-100 percent of the total thickness of the embedded interconnect, and a thickness of the second portion of the embedded interconnect is in a range of about 0-50 percent of the total thickness of the embedded interconnect. In some implementations, the first portion of the embedded interconnects (e.g., 503a) has a first planar cross section that is approximately the same as a second planar cross section of the second portion of the embedded interconnects (e.g., 503a). In some implementations, a planar cross section may be a cross section that travels along an X and/or Y direction.

Figure 6A:
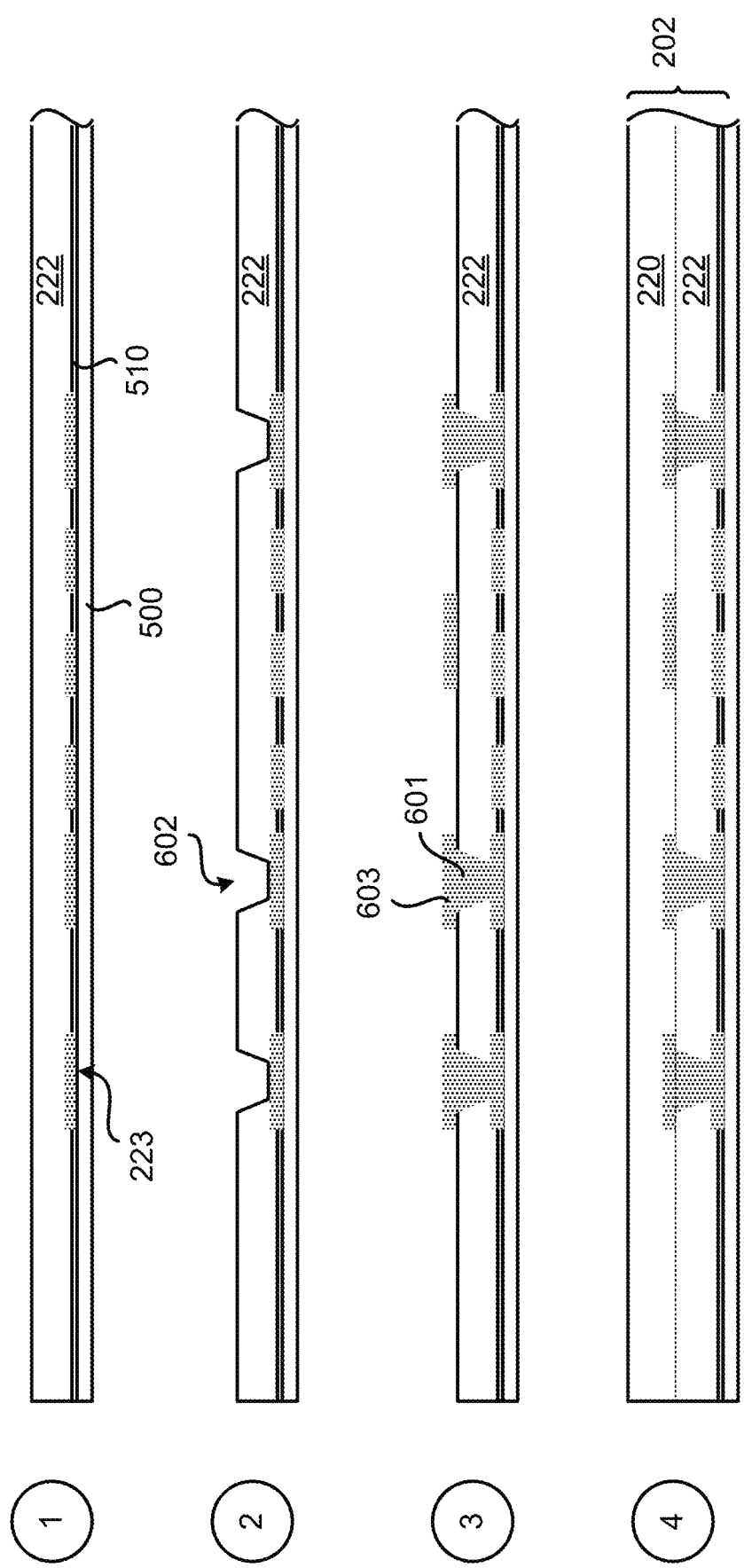
FIG. 6 (comprising FIGS. 6A-6C) illustrates an exemplary sequence for fabricating a coreless substrate that includes embedded interconnects.
Figure 6B:
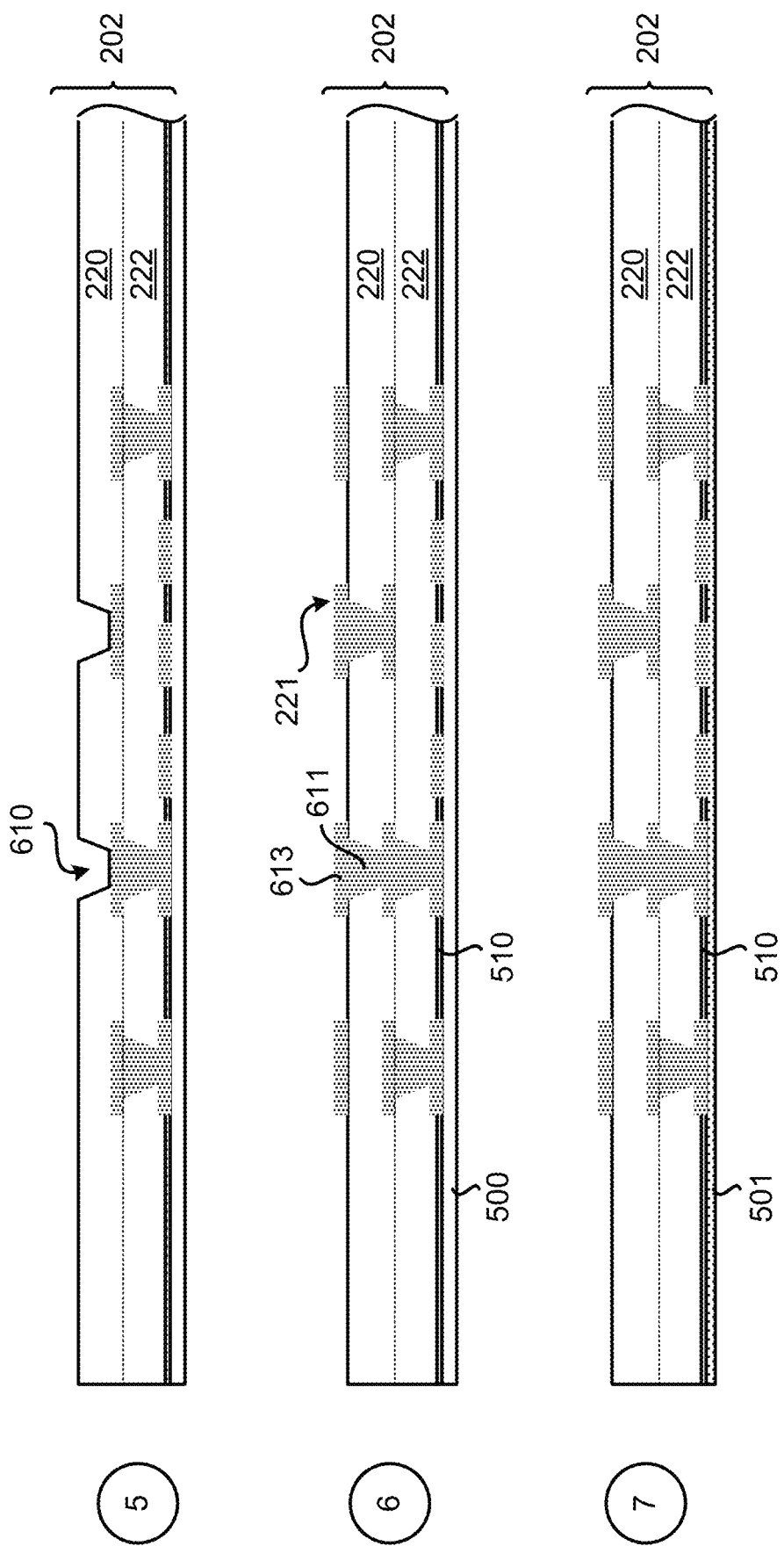
Figure 6C:
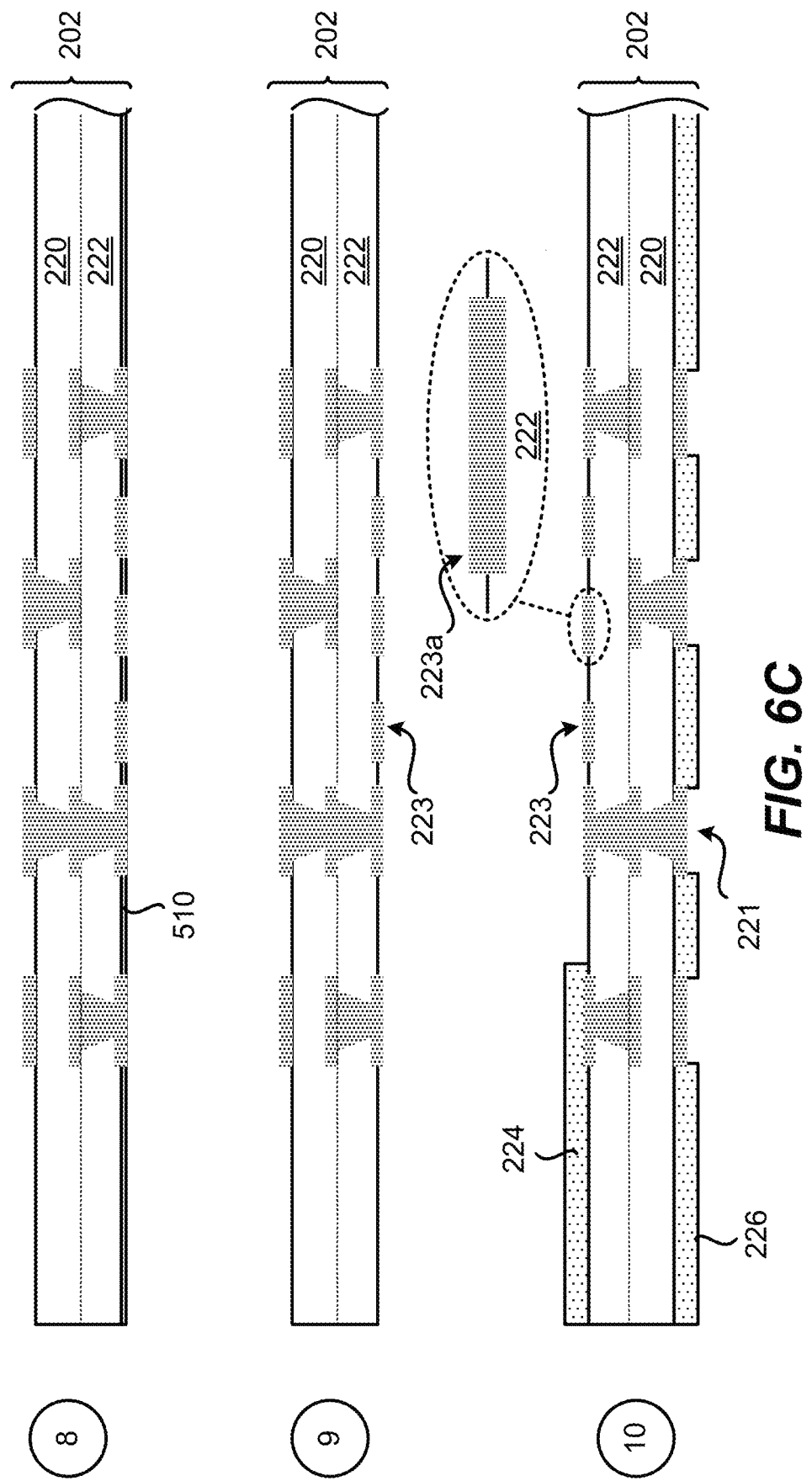

In some implementations, the sequence of FIGS. 5A-5B may be used to fabricate the plurality of interconnects 223 of FIG. 2. In some implementations, the sequence of FIGS. 5A-5B may be part of a fabrication process that includes forming several build up layers, such as shown in FIGS. 6A-6C.

Different implementations may use different processes for forming the metal layer(s). In some implementations, a chemical vapor deposition (CVD) process and/or a physical vapor deposition (PVD) process for forming the metal layer(s). For example, a sputtering process, a spray coating process, and/or a plating process may be used to form the metal layer(s).

Exemplary Sequence for Fabricating a Coreless Substrate

In some implementations, fabricating a coreless substrate includes several processes. FIG. 6 (which includes FIGS. 6A-6C) illustrates an exemplary sequence for providing or fabricating a coreless substrate that includes embedded interconnects. In some implementations, the sequence of FIGS. 6A-6C may be used to provide or fabricate the coreless substrate (e.g., 202) of FIG. 2.

It should be noted that the sequence of FIGS. 6A-6C may combine one or more stages in order to simplify and/or clarify the sequence for providing or fabricating a substrate. In some implementations, the order of the processes may be changed or modified. In some implementations, one or more of processes may be replaced or substituted without departing from the spirit of the disclosure.

Stage 1, as shown in FIG. 6A, illustrates a state after a carrier 500, a dielectric layer 510, a dielectric layer 222 and a plurality of embedded interconnects 223 are provided. In some implementations, the dielectric layer 222 may include the dielectric layer 228. The dielectric layer 510 is located between the carrier 500 and the dielectric layer 222. In some implementations, the carrier 500 may include the core layer 505, the foil layer 507 and the seed layer 501. An example of fabricating the dielectric layer 222 and the plurality of embedded interconnects 223 is illustrated and described in FIGS. 5A-5B.

Stage 2 illustrates a state after cavities 602 are formed in the dielectric layer 222. The cavities may be formed using an etching process or laser process.

Stage 3 illustrates a state after interconnects (e.g., traces, pads, vias) are formed in and over the dielectric layer 222. For example, the via 601 and the pad 603 are formed in (e.g., in the cavity) and over the dielectric layer 222. A plating process may be used to form the interconnects. Forming interconnects may include providing a patterned metal layer over and/or in the dielectric layer.

Stage 4 illustrates a state after another dielectric layer 220 (e.g., second dielectric layer) is formed over the dielectric layer 222 and the interconnects. Different implementations may use different processes for forming the dielectric layer. For example, a lamination process may be used to form the dielectric layer.

Stage 5, as shown in FIG. 6B, illustrates a state after cavities 610 are formed in the dielectric layer 220. The cavities may be formed using an etching process or laser process.

Stage 6 illustrates a state after interconnects (e.g., traces, pads, vias) are formed in and over the dielectric layer 220. For example, the via 611 and the pad 613 are formed in (e.g., in the cavity) and over the dielectric layer 220. A plating process may be used to form the interconnects. Forming interconnects may include providing a patterned metal layer over and/or in the dielectric layer. Stage 6 illustrates that the carrier 500, which may include the core layer 505, the foil layer 507 and the seed layer 501, is coupled to the dielectric layer 222.

Stage 7 illustrates a state after a portion of the carrier 500, such as the core layer 505 and the foil layer 507, have been decoupled (e.g., separated) from the seed layer 501 and the coreless substrate 202. In some implementations, a mechanical separation is used to decouple the core layer 505 and the foil layer 507 from the seed layer 501.

Stage 8, as shown in FIG. 6C, illustrates a state after the seed layer 501 has been decoupled (e.g., removed, etched out, grinded out) from the dielectric layer 222, leaving the coreless substrate 202 that includes the dielectric layer 510.

Stage 9 illustrates a state after the dielectric layer 510 has been removed, leaving the dielectric layer 222. As shown at stage 9, the plurality of embedded interconnects 223 may be embedded through a planar surface of the dielectric layer 222, such that a first portion of the embedded interconnect is located in the dielectric layer 222 and a second portion of the embedded interconnect is protruding from a planar surface of the dielectric layer 222. In some implementations, a de-smear process may be used to solubly remove the dielectric layer 510 from the dielectric layer 222. For example, the dielectric layer 510 may be removed by chemical etching. The removal of the dielectric layer 510 leaves a coreless substrate 202 that includes the plurality of embedded interconnects 223. It is noted that in some implementations, all of the dielectric layer 510 is removed, while in other implementations, there may be some residual of the dielectric layer 510. Similarly, some of the dielectric layer 222 may be removed in a process that removes the dielectric layer 510.

Stage 10 illustrates a state after a first solder resist layer 224 and a second solder resist layer 226 are respectively formed over a first planar surface and a second planar surface of the substrate 202. In some implementations, the first portion of the embedded interconnects (e.g., 223a) has a first planar cross section that is approximately the same as a second planar cross section of the second portion of the embedded interconnects (e.g., 223a). In some implementations, a planar cross section may be a cross section that travels along an X and/or Y direction.

Different implementations may use different processes for forming the metal layer(s). In some implementations, a chemical vapor deposition (CVD) process and/or a physical vapor deposition (PVD) process for forming the metal layer(s). For example, a sputtering process, a spray coating process, and/or a plating process may be used to form the metal layer(s).

Exemplary Flow Diagram of a Method for Fabricating a Coreless Substrate

Figure 7:
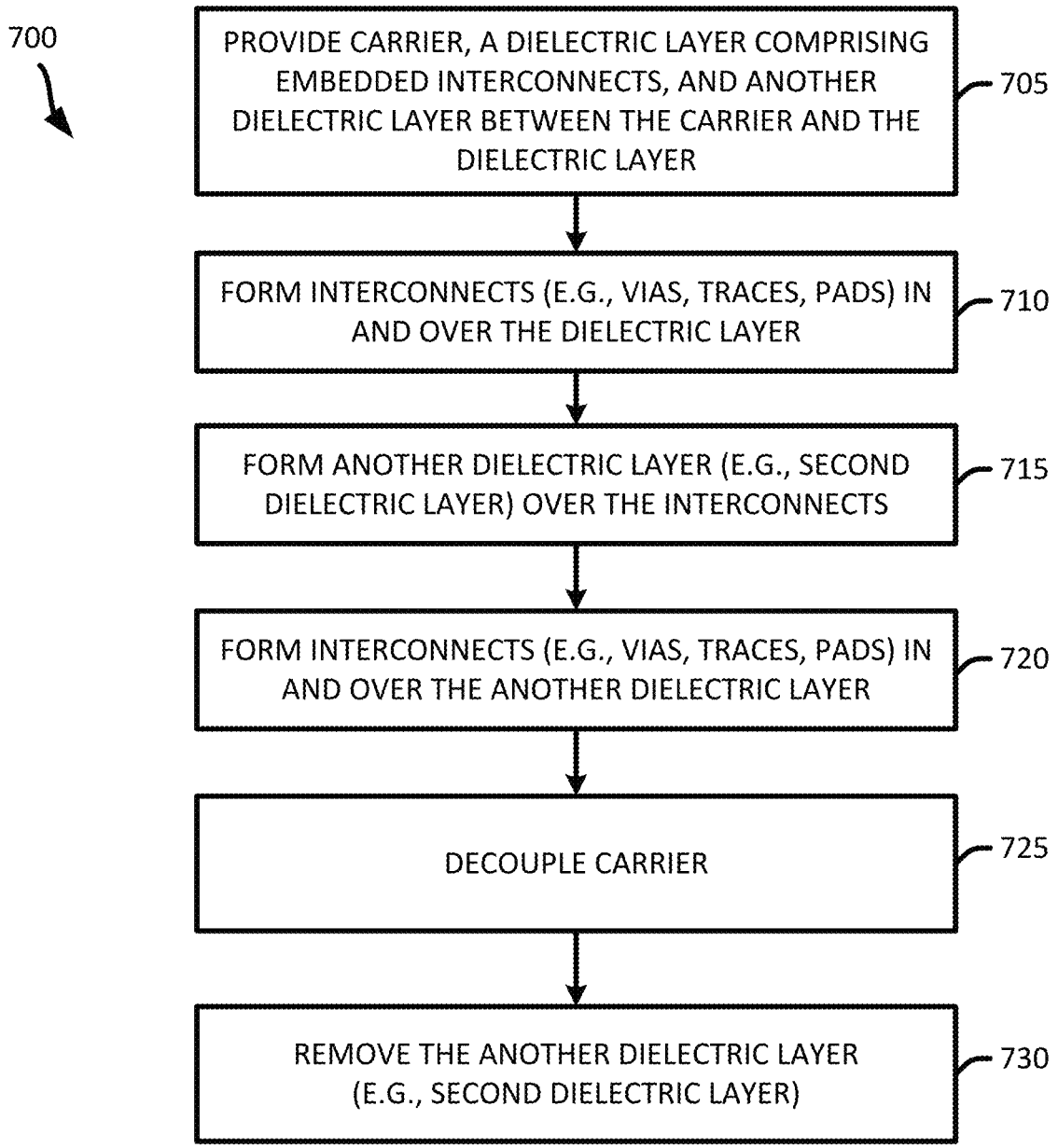
FIG. 7 illustrates an exemplary flow diagram of a method for fabricating a coreless substrate that includes embedded interconnects.

In some implementations, fabricating a coreless substrate includes several processes. FIG. 7 illustrates an exemplary flow diagram of a method 700 for providing or fabricating a coreless substrate. In some implementations, the method 700 of FIG. 7 may be used to provide or fabricate the coreless substrate of FIG. 2 described in the present disclosure. For example, the method of FIG. 7 may be used to fabricate the coreless substrate 202.

It should be noted that the sequence of FIG. 7 may combine one or more processes in order to simplify and/or clarify the method for providing or fabricating a coreless substrate. In some implementations, the order of the processes may be changed or modified.

The method provides (at 705) a carrier (e.g., 500), a dielectric layer (e.g., 222) that includes embedded interconnects (e.g., 223), and a dielectric layer (e.g., 510). The dielectric layer may be located between the carrier and the dielectric layer. In some implementations, the dielectric layer and the dielectric layer may be the same material. Stage 1 of FIG. 6A, illustrates an example of a carrier, a dielectric layer that includes embedded interconnects, and a dielectric layer being provided. FIGS. 5A-5B illustrate an example of fabricating a dielectric layer that includes embedded interconnects.

The method forms (at 710) interconnects (e.g., trace, pads, vias) in and over the dielectric layer (e.g., 222). For example, the via 601 and the pad 603 may formed. One or more cavities may be formed in the dielectric layer and a plating process may be used to form the interconnects. The cavities may be formed using an etching process or laser process. Forming interconnects may include providing a patterned metal layer over and/or in the dielectric layer. Stages 2 and 3 of FIG. 6A, illustrate an example of interconnects being formed in and over a dielectric layer.

The method forms (at 715) another dielectric layer (e.g., 220) over the dielectric layer (e.g., 222) and the interconnects. Different implementations may use different processes for forming the dielectric layer. For example, a lamination process may be used to form the dielectric layer. Stage 4 of FIG. 6A, illustrates an example of another dielectric layer (e.g., second dielectric layer) being formed over a dielectric layer.

The method forms (at 720) interconnects in and over the another dielectric layer (e.g., second dielectric layer). For example, the via 611 and the pad 613 may be formed. One or more cavities may be formed in the dielectric layer and a plating process may be used to form the interconnects. The cavities may be formed using an etching process or laser process. Forming interconnects may include providing a patterned metal layer over and/or in the dielectric layer. Stages 5 and 6 of FIG. 6B, illustrate an example of interconnects being formed in and over a dielectric layer.

The method decouples (at 725) the carrier (e.g., 500) from the dielectric layer (e.g., 510) and the dielectric layer (e.g., 222). Decoupling the carrier may include removing (e.g., grinding out, etching out) the carrier (e.g., 500) from the dielectric layer(s), leaving the coreless substrate. In some implementations, decoupling the carrier from the dielectric layer may be performed in several steps. For example, decoupling the carrier may include separating the core layer (e.g., 505) and the foil layer (e.g., 507), and then decoupling the seed layer (e.g., 501). In some implementation, the coreless substrate is an embedded trace substrate (ETS). Stage 8 of FIG. 6C, illustrates an example of a substrate after the carrier has been removed.

The method removes (at 730) the dielectric layer (e.g., 510) from the dielectric layer, leaving the coreless substrate with embedded interconnects (e.g., 223). A de-smear process may be used to remove the dielectric layer. In some implementations, the coreless substrate is the coreless substrate 202. Stage 9 of FIG. 6C, illustrates an example of a substrate after the carrier and the dielectric layer have been removed.

Different implementations may use different processes for forming the metal layer(s). In some implementations, a chemical vapor deposition (CVD) process and/or a physical vapor deposition (PVD) process for forming the metal layer(s). For example, a sputtering process, a spray coating process, and/or a plating process may be used to form the metal layer(s).

Figure 8:
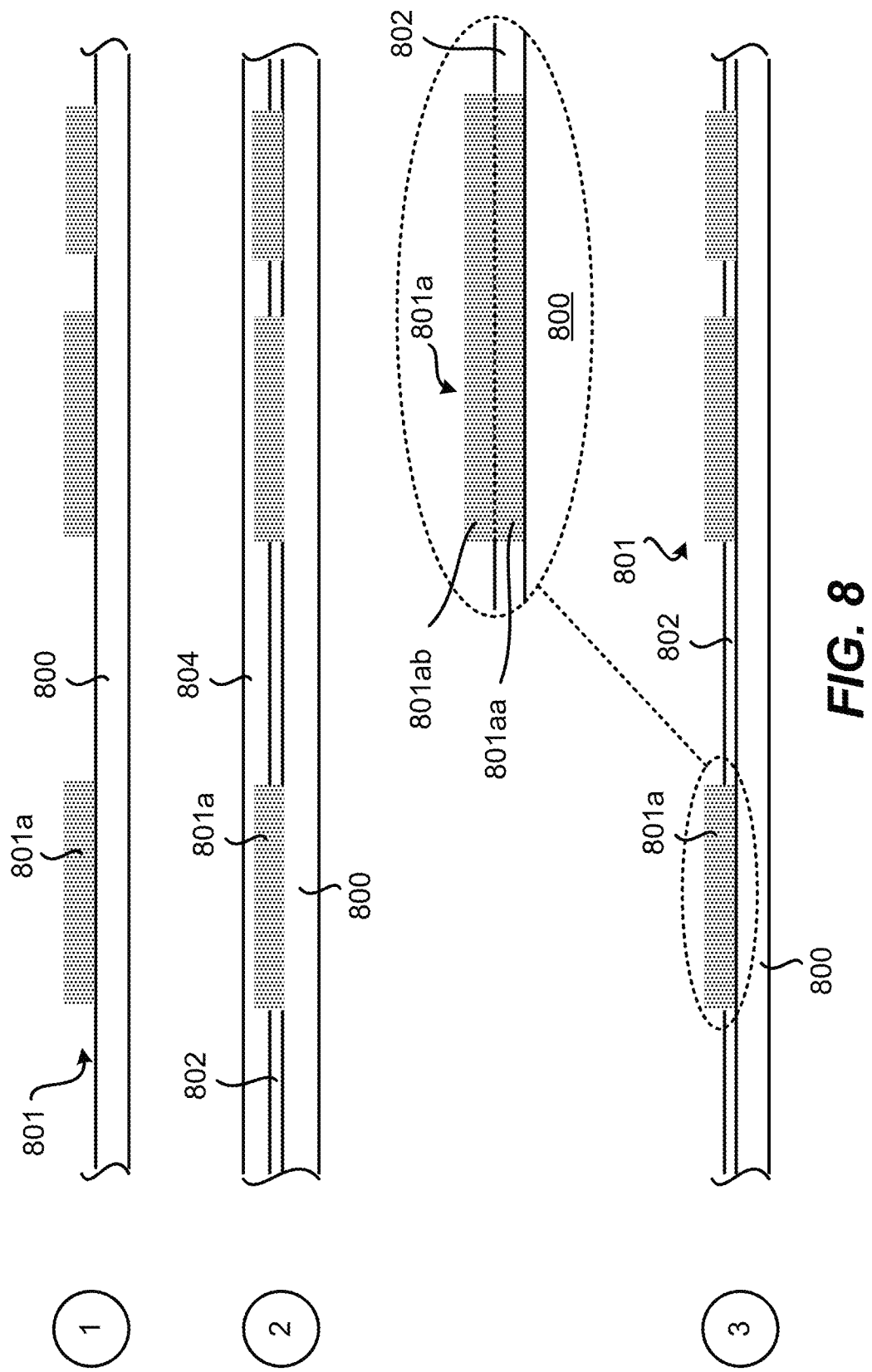
FIG. 8 illustrates an exemplary sequence for fabricating embedded interconnects in a core substrate.

Exemplary Sequence for Fabricating Embedded Interconnects in a Coreless Substrate FIG. 8 illustrates an exemplary sequence for providing or fabricating embedded interconnects in a core substrate. In some implementations, the sequence of FIG. 8 may be used to provide or fabricate the embedded interconnects (e.g., 323) of FIG. 3 and/or FIG. 4.

It should be noted that the sequence of FIG. 8 may combine one or more stages in order to simplify and/or clarify the sequence for providing or fabricating embedded interconnects in a substrate. In some implementations, the order of the processes may be changed or modified. In some implementations, one or more of processes may be replaced or substituted without departing from the spirit of the disclosure. In some implementations, the sequence of FIG. 8 may be used with a semi additive process (SAP) or a modified semi additive process (mSAP).

Stage 1, as shown in FIG. 8, illustrates a state after a plurality of interconnects 801 (e.g., traces, pads, vias) is formed over a first dielectric layer 800. A plating process may be used to form the plurality of interconnects. At this state, the plurality of interconnects 801 (e.g., 801a) is formed over the first dielectric layer 800.

Stage 2 illustrates a state after a second dielectric layer 802 and a third dielectric layer 804 are formed over the first dielectric layer 800 and the plurality of interconnects 801. The third dielectric layer 804 may be a de-smear soluble dielectric layer. A lamination process may be used to form the second dielectric layer 802 and the third dielectric layer 804. In some implementations, the second dielectric layer 802 and the third dielectric layer 804 are made of the same material. The materials for the second dielectric layer 802 and/or the third dielectric layer 804 may include dry film, such as a multi-functional filled epoxy and/or prepreg (PPG). The PPG may include glass fibers with resin. In some implementations, the first dielectric layer 800 may be different material than the second dielectric layer 802 and/or the third dielectric layer 804.

Stage 3 illustrates a state after the third dielectric layer 804 has been removed, leaving the plurality of interconnects 801 as embedded interconnects in the first dielectric layer 800 and the second dielectric layer 802. The third dielectric layer 804 may be removed through a chemical etching process. As shown in stage 3, the plurality of interconnects 801 is embedded in the first dielectric layer 800 and the second dielectric layer 802 in a way that an embedded interconnect (e.g., 801a) travels and/or is located through a first planar surface of the substrate such that a first portion (e.g., 801aa) of the embedded interconnect (e.g., 801a) is located within the dielectric layer 802 and a second portion (e.g., 801ab) of the embedded interconnect (e.g., 801a) is external of the first dielectric layer 800 and the second dielectric layer 802. In some implementations, a thickness of the first portion of the embedded interconnect is in a range of about 50-100 percent (e.g., 50-99 percent) of the total thickness of the embedded interconnect, and a thickness of the second portion of the embedded interconnect is in a range of about 0-50 percent (e.g., 1-50 percent) of the total thickness of the embedded interconnect. In some implementations, the first portion of the embedded interconnects (e.g., 801a) has a first planar cross section that is approximately the same as a second planar cross section of the second portion of the embedded interconnects (e.g., 801a). In some implementations, a planar cross section may be a cross section that travels along an X and/or Y direction.

In some implementations, the sequence of FIG. 8 may be used to fabricate the plurality of interconnects 323 of FIG. 3 and/or FIG. 4. Different implementations may use different processes for forming the metal layer(s). In some implementations, a chemical vapor deposition (CVD) process and/or a physical vapor deposition (PVD) process for forming the metal layer(s). For example, a sputtering process, a spray coating process, and/or a plating process may be used to form the metal layer(s).

Exemplary Sequence for Fabricating a Core Substrate

In some implementations, fabricating a core substrate includes several processes. FIG. 9 (which includes FIGS. 9A-9F) illustrates an exemplary sequence for providing or fabricating a core substrate that includes embedded interconnects. In some implementations, the sequence of FIGS. 9A-9F may be used to provide or fabricate the substrate (e.g., 302) of FIG. 3.

It should be noted that the sequence of FIGS. 9A-9F may combine one or more stages in order to simplify and/or clarify the sequence for providing or fabricating a substrate that includes embedded interconnects. In some implementations, the order of the processes may be changed or modified. In some implementations, one or more of processes may be replaced or substituted without departing from the spirit of the disclosure.

Figure 9A:
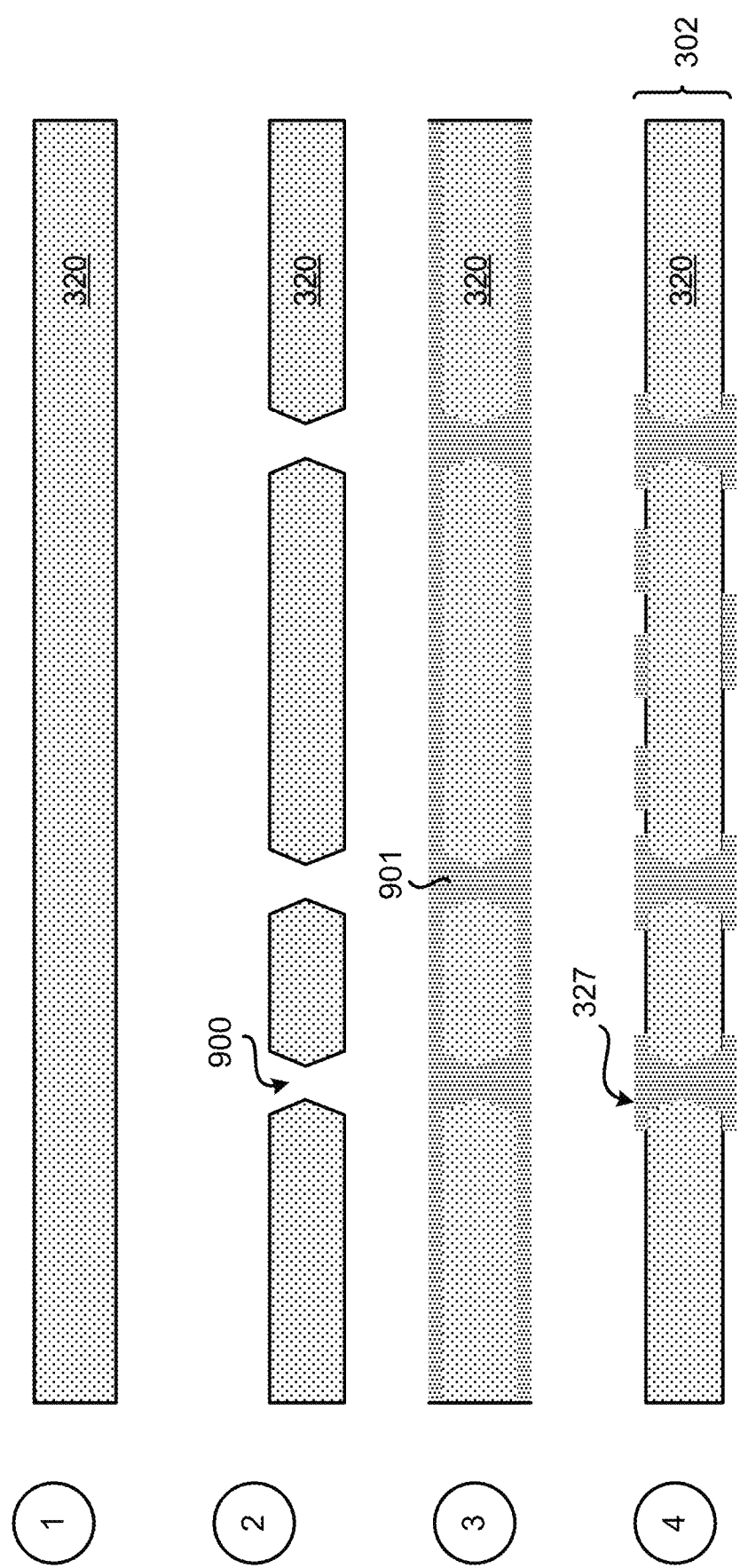
FIG. 9 (comprising FIGS. 9A-9F) illustrates an exemplary sequence for fabricating a core substrate that includes embedded interconnects.

Stage 1, as shown in FIG. 9A, illustrates a core layer 320 being provided. The core layer 320 may include different dielectric materials, such a silicon, glass, quartz, epoxy, or combinations thereof.

Stage 2 illustrates a state after a plurality of cavities 900 is formed through a first surface and a second surface of the core layer 320. In some implementations, the cavities 900 are formed using a laser process (e.g., laser drilling). As shown in stage 2, cavities 900 have side walls that are angled or nonvertical relative to the first surface and the second surface of the core layer 320.

Stage 3 illustrates a state after a metal layer 901 (e.g., copper) is formed over the first surface and second surface of the core layer 320, and the surface of the cavities 900. A plating process may be used to form the metal layer 901. The metal layer 901 may include a seed layer and/or a metal layer. Thus, the metal layer 901 may include more than one metal layer.

Stage 4 illustrates a state after the metal layer 901 has been patterned to form and/or define interconnects 327 (e.g., vias, traces, pads) for the core substrate. In some implementations, the core substrate may be the core substrate 302.

Figure 9B:
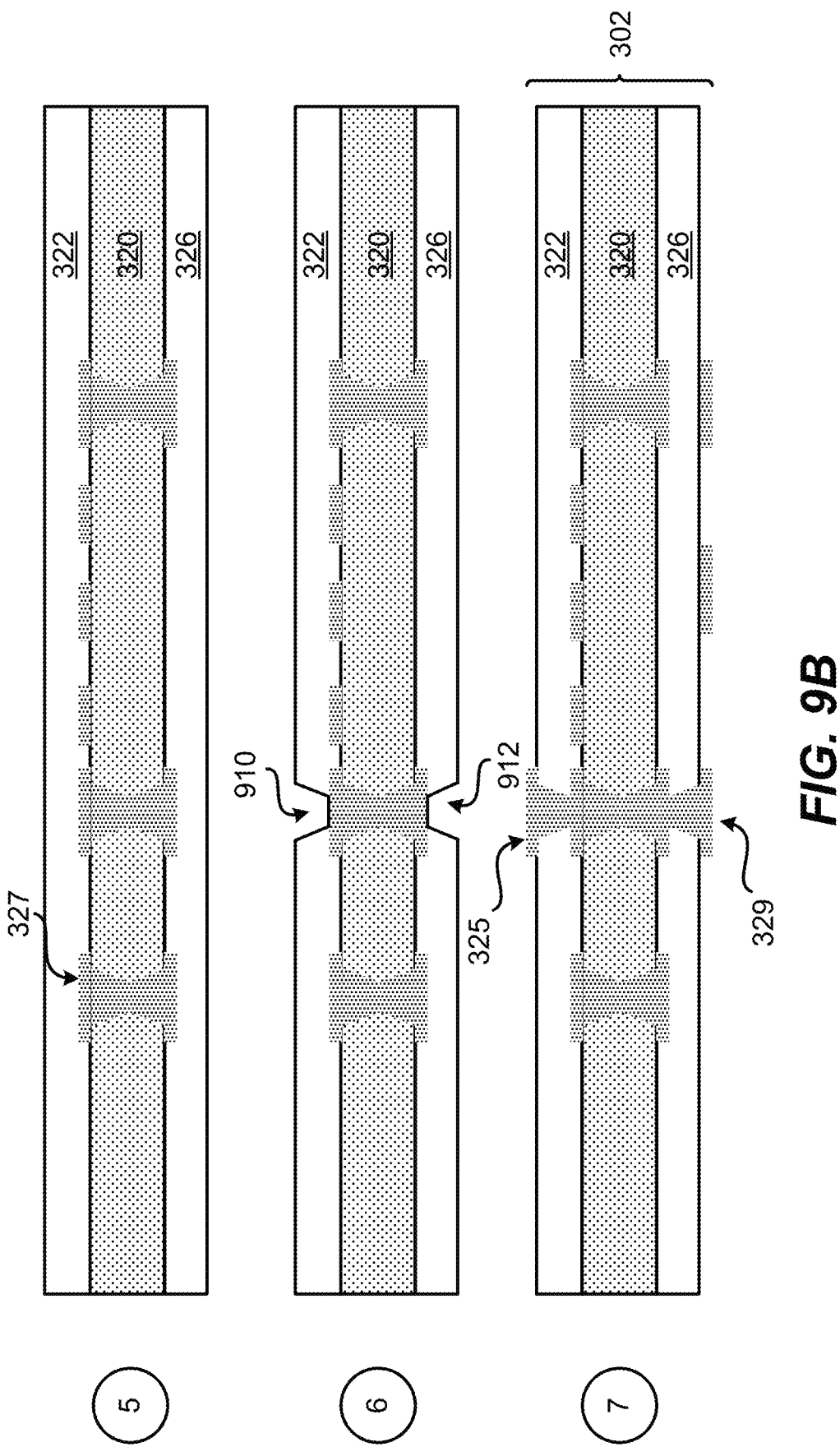

Stage 5, as shown in FIG. 9B, illustrates a dielectric layer 322 formed over a first surface of the core layer 320, and a dielectric layer 326 formed a second surface of the core layer 320. A lamination process may be used to form the dielectric layer 322 and the dielectric layer 326.

Stage 6 illustrates a state after cavities 910 are formed in the dielectric layer 322, and cavities 912 are formed in the dielectric layer 326. An etching or laser process may be used to form the cavities (e.g., 910, 912).

Stage 7 illustrates a state after interconnects (e.g., traces, pads, vias) are formed in and over the dielectric layer 322 and the dielectric layer 326. A plating process may be used to form the interconnects (e.g., 325, 329).

Figure 9C:
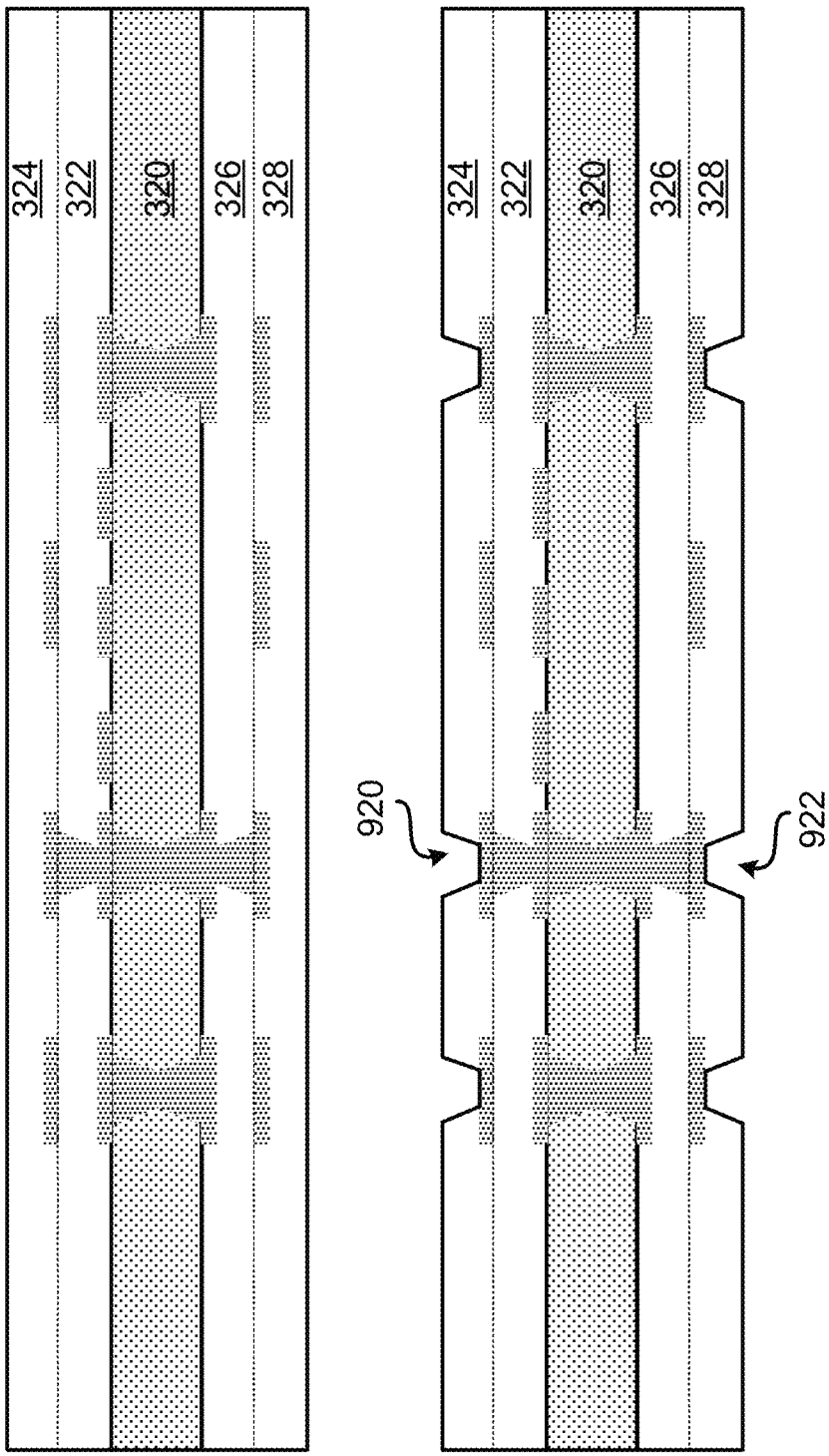

Stage 8 as shown in FIG. 9C, illustrates a dielectric layer 324 formed over the dielectric layer 322, and a dielectric layer 328 formed over the dielectric layer 326. A lamination process may be used to form the dielectric layer 324 and the dielectric layer 328.

Stage 9 illustrates a state after cavities 920 are formed in the dielectric layer 324, and cavities 922 are formed in the dielectric layer 328. An etching or laser process may be used to form the cavities (e.g., 920, 922).

Figure 9D:
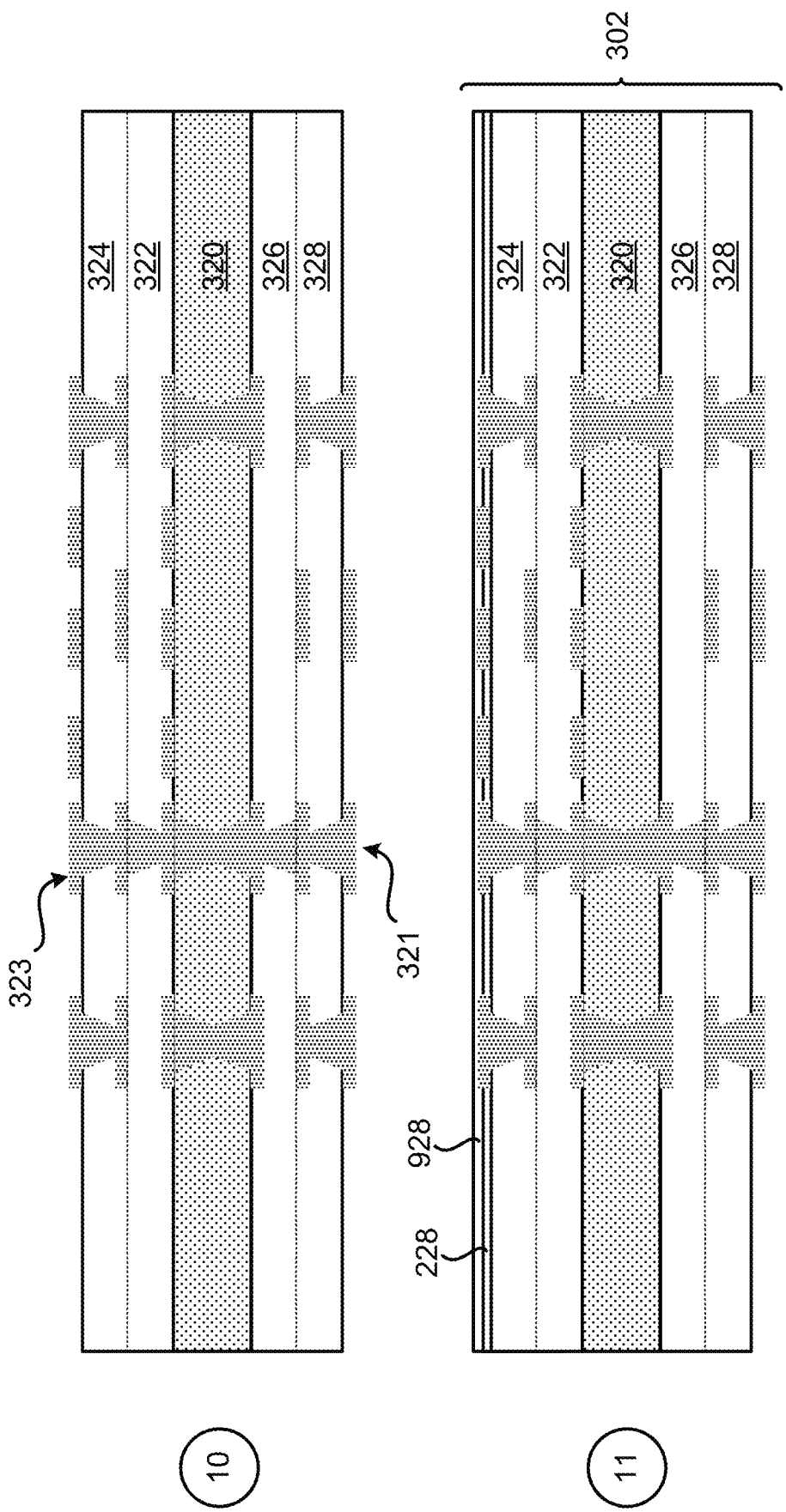

Stage 10, as shown in FIG. 9D, illustrates a state after interconnects (e.g., traces, pads, vias) are formed in and over the dielectric layer 324 and the dielectric layer 328. A plating process may be used to form the interconnects (e.g., 323, 321).

Stage 11, as shown in FIG. 9D, illustrates a state after a first dielectric layer 228 and a second dielectric layer 928 have been formed over a first surface of the core substrate 302. In some implementations, the first dielectric layer 228 and the second dielectric layer 928 are made of the same material. The materials for the first dielectric layer 228, the second dielectric layer 928 and/or the dielectric layer(s) (e.g., 322, 324, 326, 328) may include dry film, such as a multi-functional filled epoxy and/or prepreg (PPG). The PPG may include glass fibers with resin.

Figure 9E:
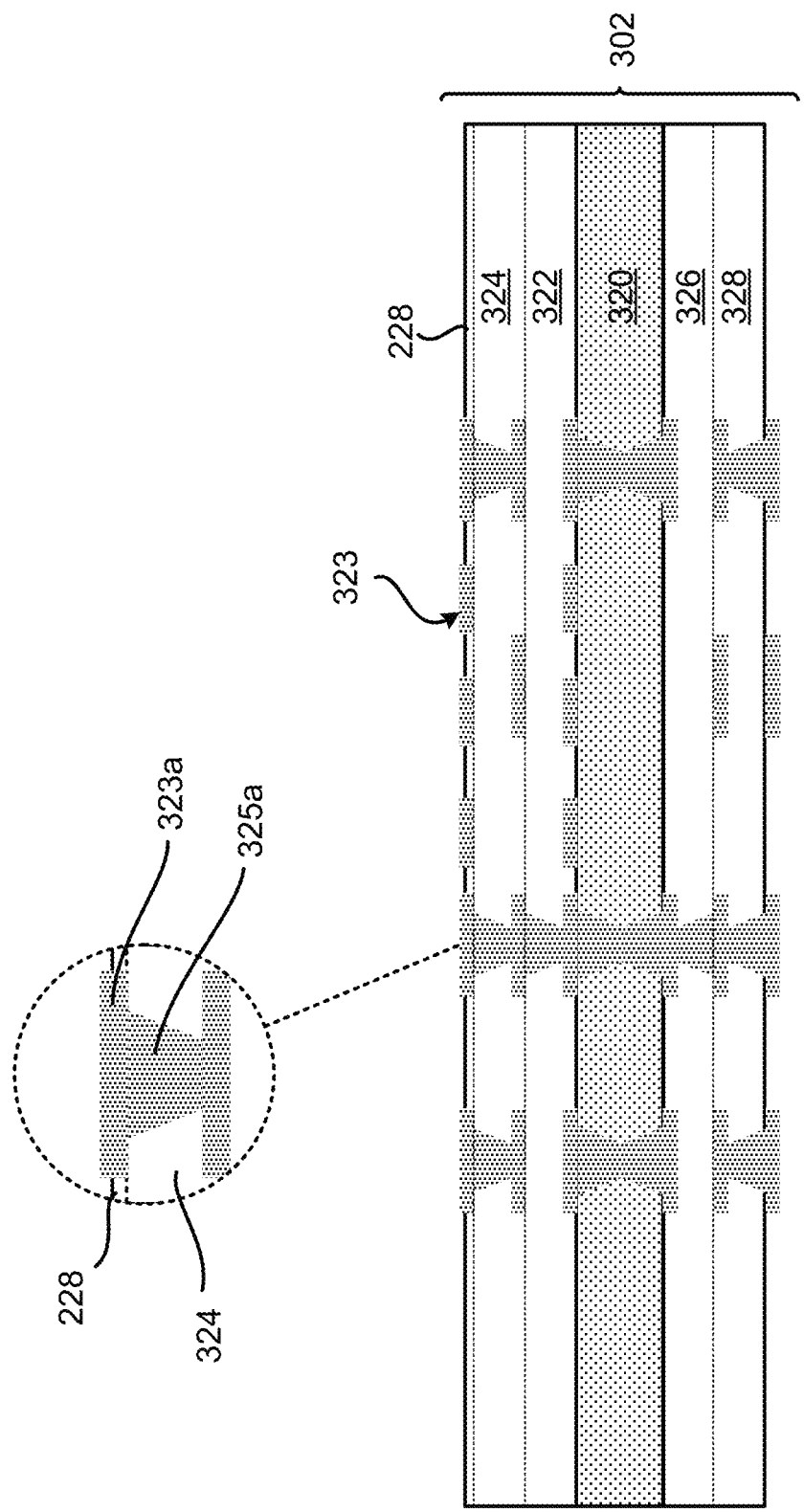

Stage 12, as shown in FIG. 9E, illustrates a state after the second dielectric layer 928 has been removed from the first dielectric layer 228, leaving the embedded interconnects 323 in the core substrate 302. In some implementations, a de-smear process may be used to solubly remove the second dielectric layer 928 from the first dielectric layer 228. For example, the second dielectric layer 928 may be removed by chemical etching.

Figure 9F:
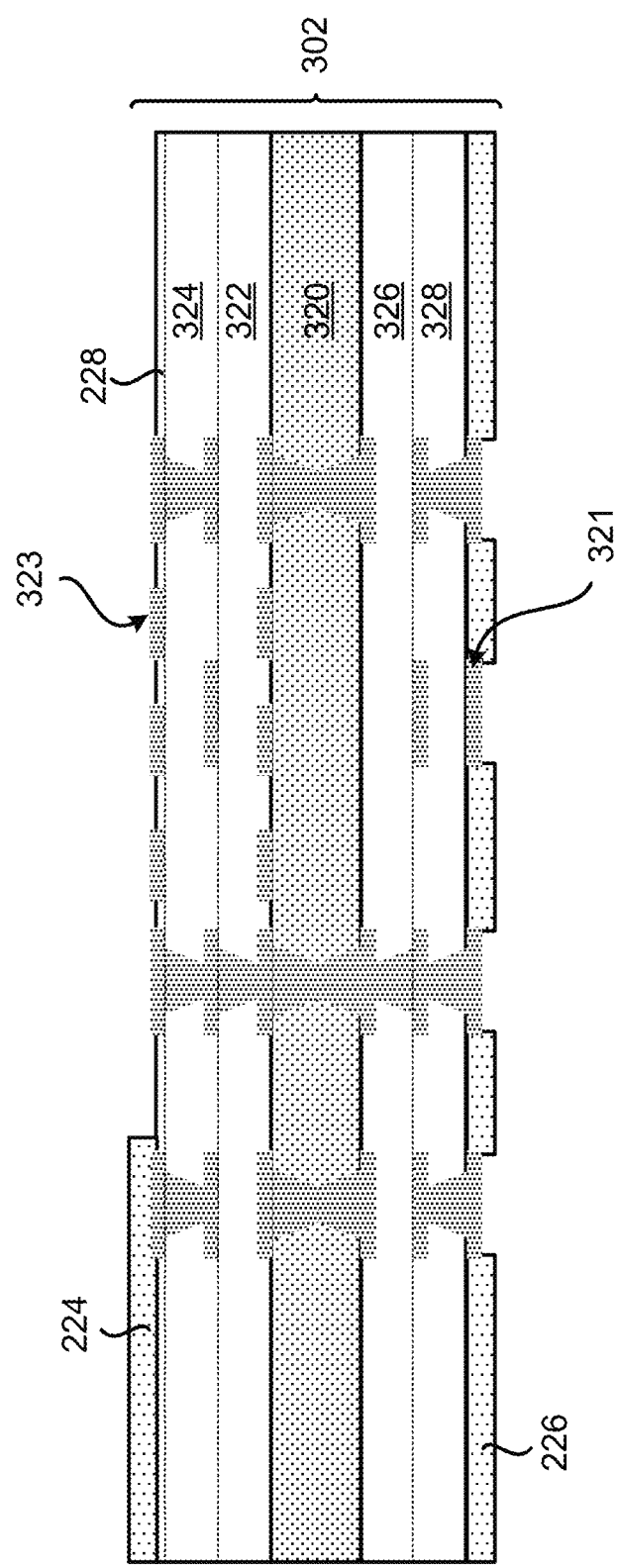

Stage 13, as shown in FIG. 9F, illustrates a state after a first solder resist layer 224 and a second solder resist layer 226 are respectively formed over a first planar surface and a second planar surface of the substrate 302.

Different implementations may use different processes for forming the metal layer(s). In some implementations, a chemical vapor deposition (CVD) process and/or a physical vapor deposition (PVD) process for forming the metal layer(s). For example, a sputtering process, a spray coating process, and/or a plating process may be used to form the metal layer(s).

Exemplary Sequence for Fabricating a Core Substrate

In some implementations, fabricating a core substrate includes several processes. FIG. 10 (which includes FIGS. 10A-10F) illustrates an exemplary sequence for providing or fabricating a core substrate that includes embedded interconnects. In some implementations, the sequence of FIGS. 10A-10F may be used to provide or fabricate the substrate (e.g., 402) of FIG. 4.

It should be noted that the sequence of FIGS. 10A-10F may combine one or more stages in order to simplify and/or clarify the sequence for providing or fabricating a substrate that includes embedded interconnects. In some implementations, the order of the processes may be changed or modified. In some implementations, one or more of processes may be replaced or substituted without departing from the spirit of the disclosure.

Stage 1, as shown in FIG. 10A, illustrates a core layer 320 being provided. The core layer 320 may include different dielectric materials, such a silicon, glass, quartz, epoxy, or combinations thereof.

Stage 2 illustrates a state after a plurality of cavities 1000 are formed through a first surface and a second surface of the core layer 320. In some implementations, the cavities 1000 are formed using drilling process (e.g., mechanical drilling). The cavities 1000 may be formed such that the cavities have side walls that approximately vertical to a first surface and/or a second surface of the core layer 320.

Stage 3 illustrates a state after a metal layer 1001 (e.g., copper) is formed over the first surface and second surface of the core layer 320, and the surface of the cavities 1000. A plating process may be used to form the metal layer 1001. The metal layer 1001 may include a seed layer and/or a metal layer. Thus, the metal layer 1001 may include more than one metal layer.

Stage 4 illustrates a state after the metal layer 1001 has been patterned to form and/or define interconnects (e.g., vias, traces, pads) for the core substrate. In some implementations, the core substrate may be the core substrate 402.

Stage 5, as shown in FIG. 10B, illustrates a dielectric layer 322 formed over a first surface of the core layer 320, and a dielectric layer 326 formed a second surface of the core layer 320. A lamination process may be used to form the dielectric layer 322 and the dielectric layer 326.

Stage 6 illustrates a state after cavities 910 are formed in the dielectric layer 322, and cavities 912 are formed in the dielectric layer 326. An etching or laser process may be used to form the cavities (e.g., 910, 912).

Stage 7 illustrates a state after interconnects (e.g., traces, pads, vias) are formed in and over the dielectric layer 322 and the dielectric layer 326. A plating process may be used to form the interconnects (e.g., 325, 329).

Figure 10C:
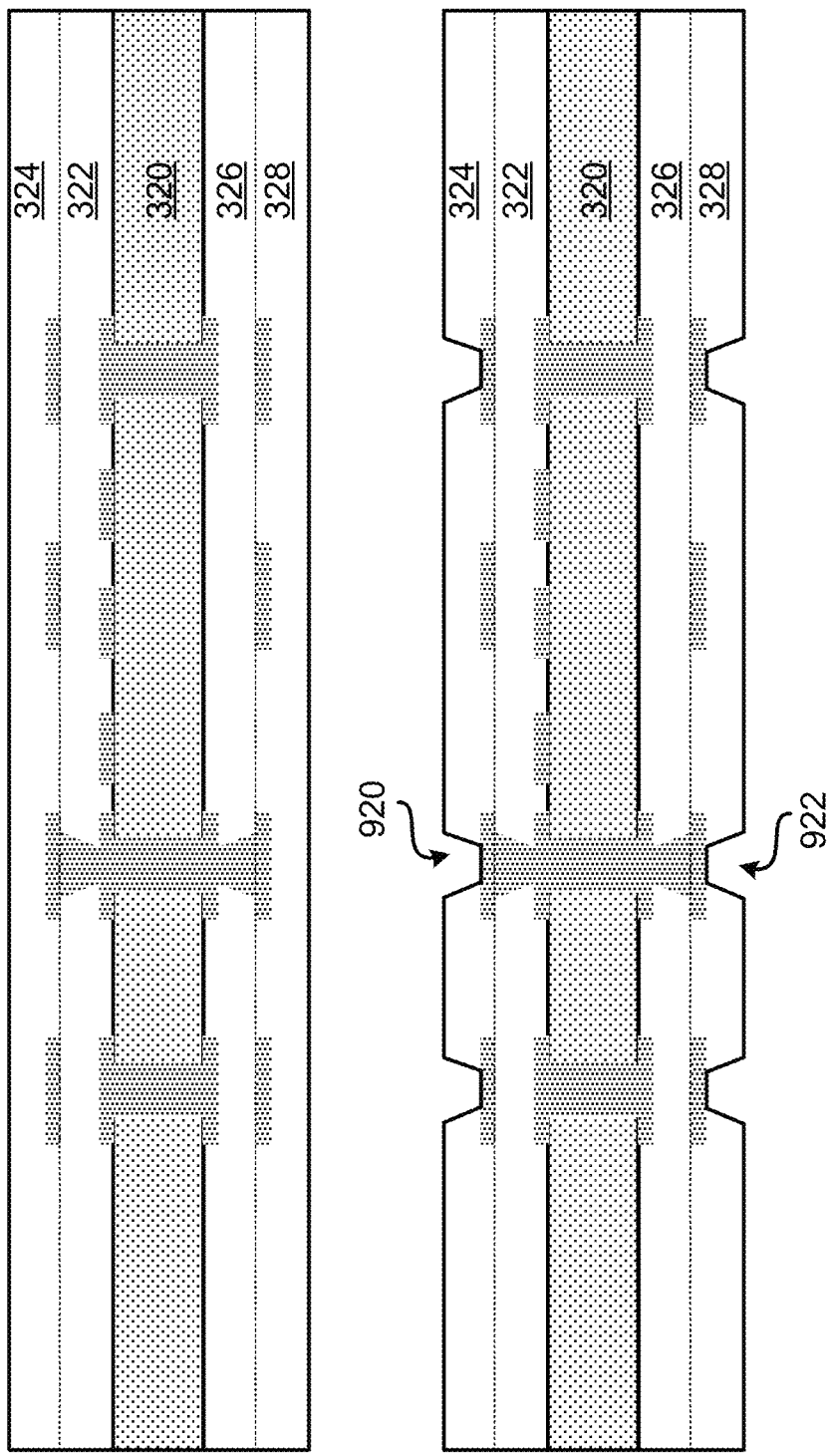
FIG. 10 (comprising FIGS. 10A-10F) illustrates an exemplary sequence for fabricating a core substrate that includes embedded interconnects.

Stage 8 as shown in FIG. 10C, illustrates a dielectric layer 324 formed over the dielectric layer 322, and a dielectric layer 328 formed over the dielectric layer 326. A lamination process may be used to form the dielectric layer 324 and the dielectric layer 328.

Stage 9 illustrates a state after cavities 920 are formed in the dielectric layer 324, and cavities 922 are formed in the dielectric layer 328. An etching or laser process may be used to form the cavities (e.g., 920, 922).

Figure 10D:
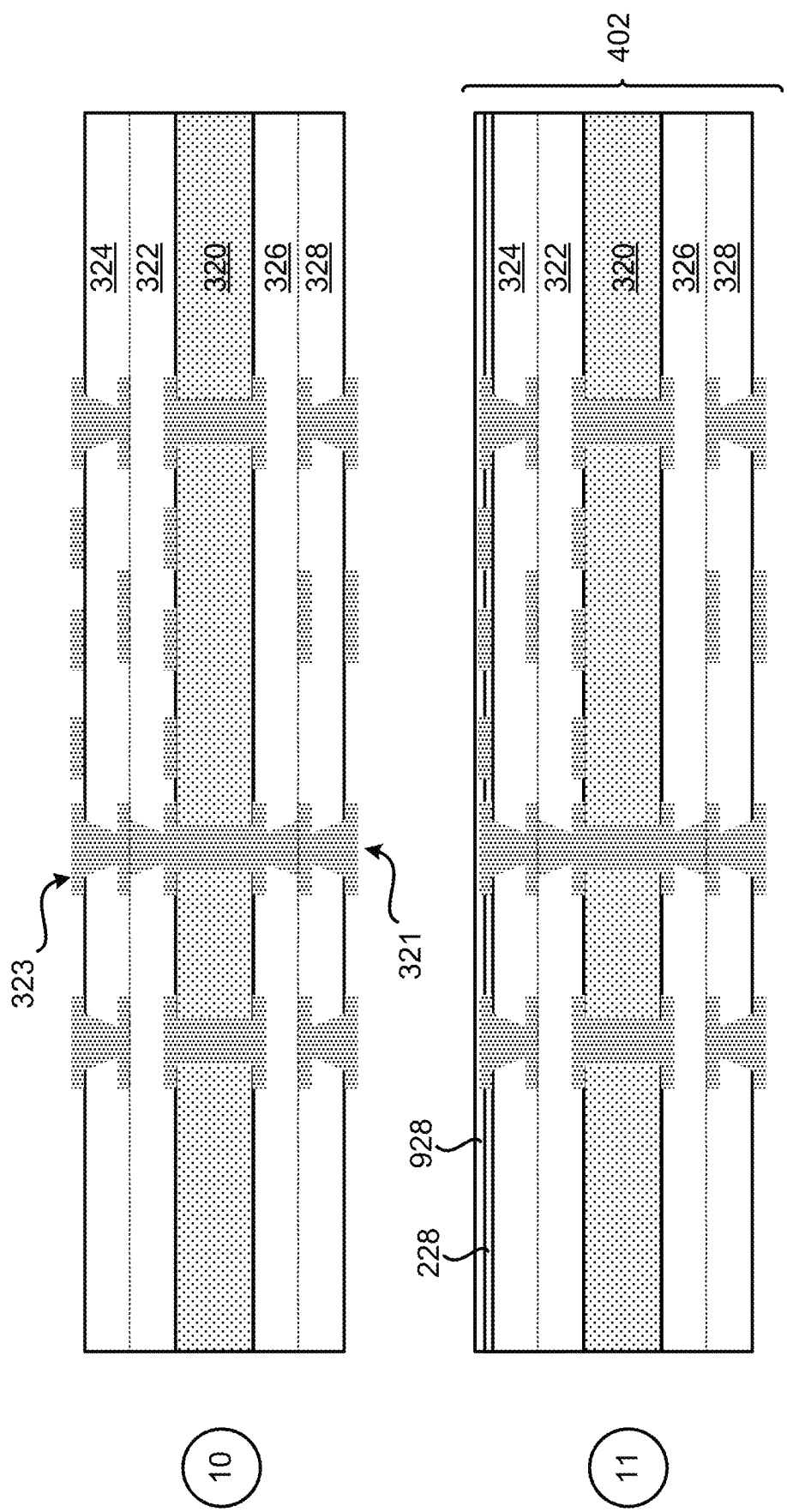

Stage 10, as shown in FIG. 10D, illustrates a state after interconnects (e.g., traces, pads, vias) are formed in and over the dielectric layer 324 and the dielectric layer 328. A plating process may be used to form the interconnects (e.g., 323, 321).

Stage 11, as shown in FIG. 10D, illustrates a state after a first dielectric layer 228 and a second dielectric layer 928 have been formed over a first surface of the core substrate 402. In some implementations, the first dielectric layer 228 and the second dielectric layer 928 are made of the same material. The materials for the first dielectric layer 228, the second dielectric layer 928 and/or the dielectric layer(s) (e.g., 322, 324, 326, 328) may include dry film, such as a multi-functional filled epoxy and/or prepreg (PPG). The PPG may include glass fibers with resin.

Figure 10E:
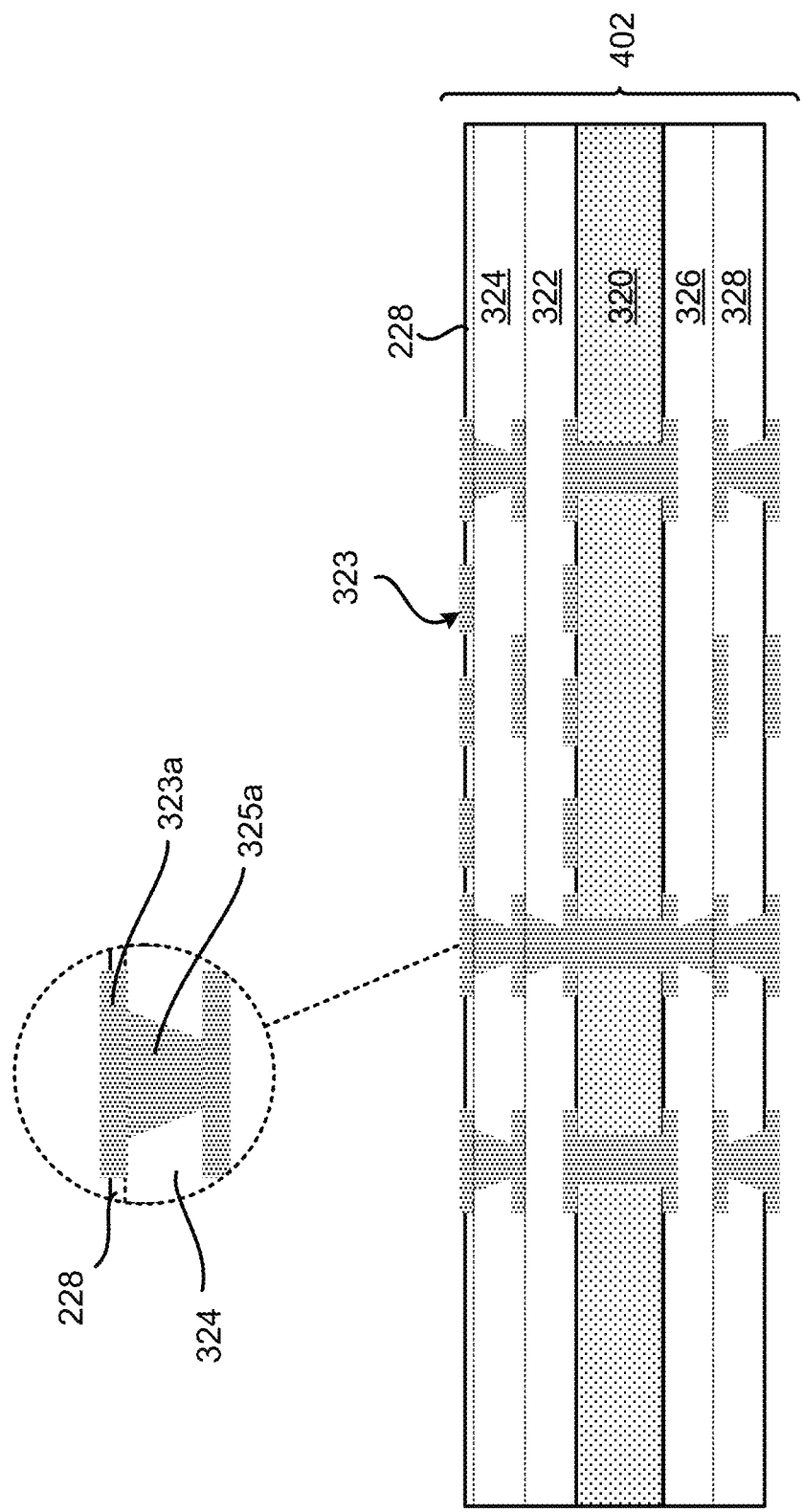

Stage 12, as shown in FIG. 10E, illustrates a state after the second dielectric layer 928 has been removed from the first dielectric layer 228, leaving the embedded interconnects 323 in the core substrate 402. In some implementations, a de-smear process may be used to solubly remove the second dielectric layer 928 from the first dielectric layer 228. For example, the second dielectric layer 928 may be removed by chemical etching.

Figure 10F:
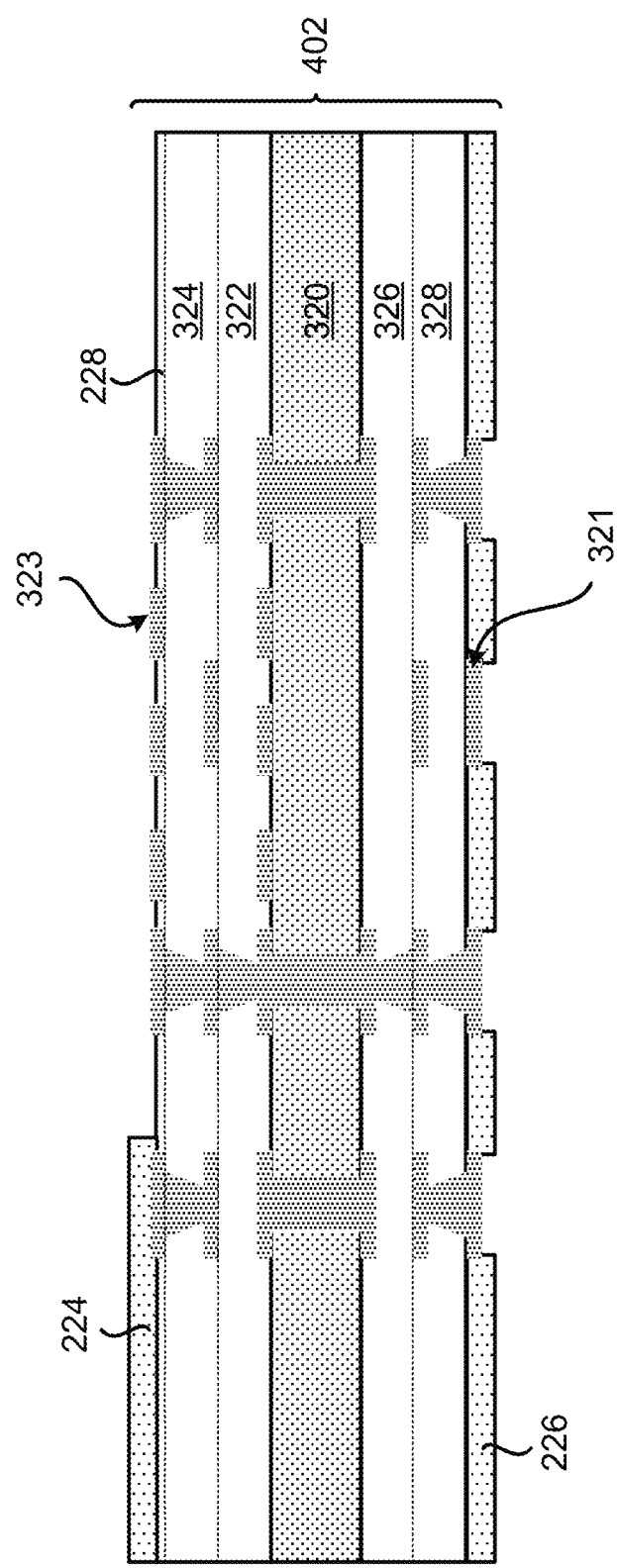

Stage 13, as shown in FIG. 10F, illustrates a state after a first solder resist layer 224 and a second solder resist layer 226 are respectively formed over a first planar surface and a second planar surface of the substrate 402.

Different implementations may use different processes for forming the metal layer(s). In some implementations, a chemical vapor deposition (CVD) process and/or a physical vapor deposition (PVD) process for forming the metal layer(s). For example, a sputtering process, a spray coating process, and/or a plating process may be used to form the metal layer(s).

Exemplary Flow Diagram of a Method for Fabricating a Core Substrate

Figure 11:
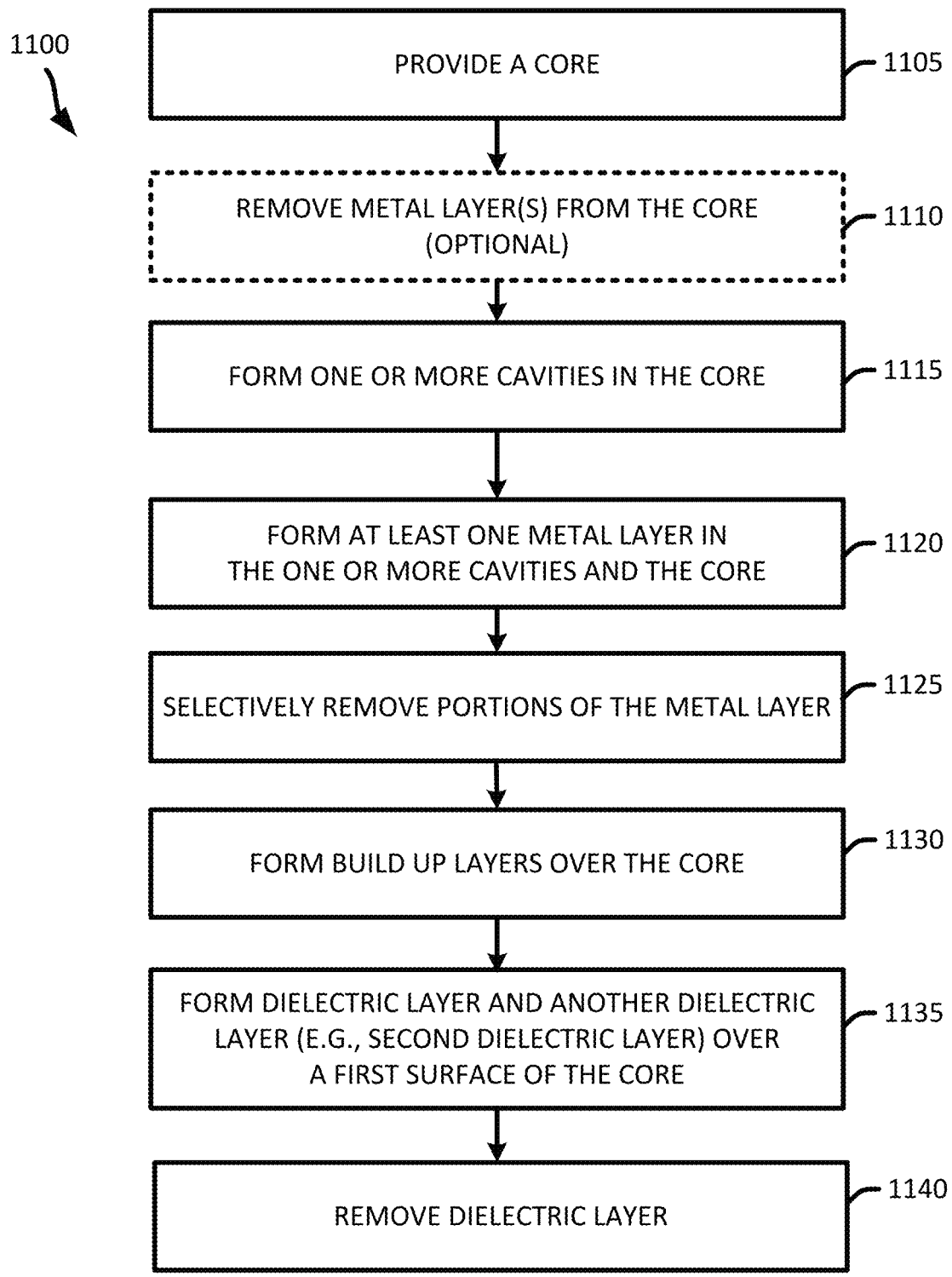
FIG. 11 illustrates an exemplary flow diagram of a method for fabricating a core substrate that includes embedded interconnects.

In some implementations, fabricating a core substrate includes several processes. FIG. 11 illustrates an exemplary flow diagram of a method 1100 for providing or fabricating a core substrate. In some implementations, the method 1100 of FIG. 11 may be used to provide or fabricate the core substrate of FIG. 3 and/or FIG. 4 described in the present disclosure. For example, the method of FIG. 11 may be used to fabricate the core substrates 302 and/or 402.

It should be noted that the sequence of FIG. 11 may combine one or more processes in order to simplify and/or clarify the method for providing or fabricating a core substrate. In some implementations, the order of the processes may be changed or modified.

The method 1100 provides (at 1105) a core layer 320. The core layer 320 may include different dielectric materials, such a silicon, glass, quartz, epoxy, or combinations thereof.

The method 1100 may optionally remove (at 1110) metal layers over the core layer 320. In some implementations, the core layer 320 may come with one or more metal layers formed over the first and/or second surfaces of the core layer 320. In such instances, the metal layer may be patterned (e.g., by using an etching process).

The method forms (at 1115) a plurality of cavities through the core layer 320. The plurality of cavities (e.g., 900, 1000) may be formed using a laser process or a drilling process, as described in FIGS. 9A and 10A. The plurality of cavities may be through holes.

The method forms (at 1120) a metal layer (e.g., 901, 1001) over the first surface and second surface of the core layer 320, and the surface of the cavities (e.g., 900, 1000). A plating process may be used to form the metal layer. The metal layer may include a seed layer and/or a metal layer.

The method selectively removes (at 1125) portions of the metal layer (e.g., 901, 1001). Stage 4 of FIG. 9A illustrates a state after the metal layer (e.g., 901) has been patterned to form and/or define interconnects (e.g., vias, traces, pads) for the core substrate. In some implementations, the core substrate may be the core substrate 302 or the core substrate 402.

The method forms (at 1130) one or more build up layers over the core layer (e.g., 320). The build up layers may include dielectric layers and a plurality of interconnects.

Examples of build up layers include the dielectric layers (322, 324, 326, 328) and the interconnects (325, 329) of FIGS. 3 and 4. FIGS. 9B-9E and 10B-10E illustrate examples of fabricating build up layers over a core layer for a core substrate.

The method forms (at 1135) a dielectric layer (e.g., 228) and another dielectric layer (e.g., 928) over the first planar surface of the core substrate 302. For example, the dielectric layer (e.g., 228) and another dielectric layer (e.g., 928) may be formed over the dielectric layer 324. The dielectric layer and the another dielectric layer (e.g., second dielectric layer) may be made of the same material. The materials for the dielectric layer (e.g., 228) and/or the another dielectric layer (e.g., 928) may include dry film, such as a multi-functional filled epoxy and/or prepreg (PPG). The PPG may include glass fibers with resin.

The method removes (at 1140) the another dielectric layer (e.g., 228) from the dielectric layer (e.g., 928), leaving the embedded interconnects (e.g., 323) in the core substrate (e.g., 302, 402). In some implementations, a de-smear process may be used to solubly remove the another dielectric layer (e.g., 928) from the dielectric layer (e.g., 228). For example, the another dielectric layer may be removed by chemical etching.

Different implementations may use different processes for forming the metal layer(s). In some implementations, a chemical vapor deposition (CVD) process and/or a physical vapor deposition (PVD) process for forming the metal layer(s). For example, a sputtering process, a spray coating process, and/or a plating process may be used to form the metal layer(s).

Exemplary Device Comprising Substrate with Embedded Interconnects

Figure 12:
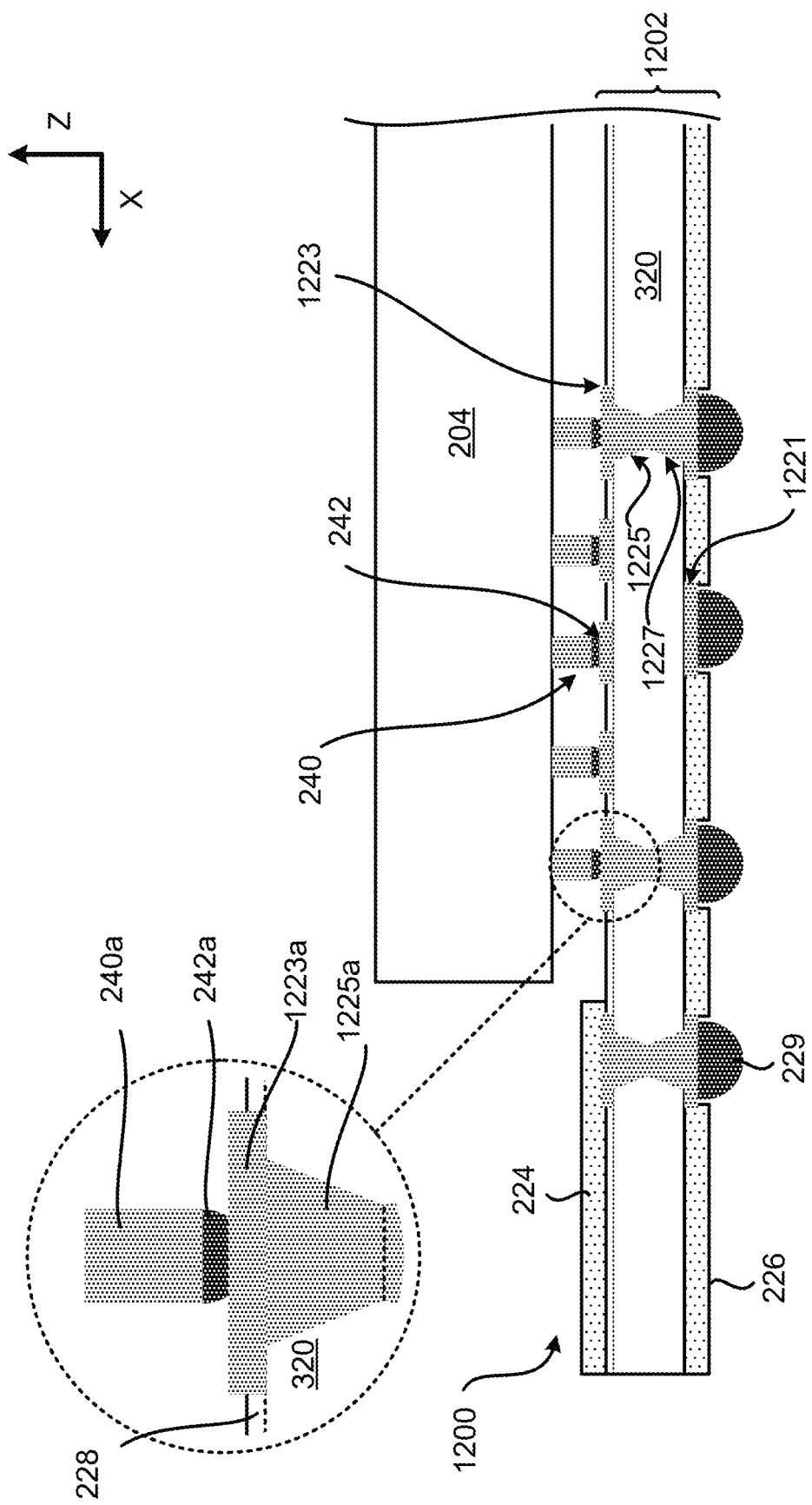
FIG. 12 illustrates a profile view of a package that includes a die and a core substrate with embedded surface interconnects.

FIG. 12 illustrates a profile view of a device 1200 that includes a substrate 1202 and the die 204. The device 1200 may be an integrated device and/or an integrated package (e.g. integrated circuit (IC) package). The substrate 1202 includes a core layer 320, the first solder resist layer 224, the second solder resist layer 226, the plurality of interconnects 1221, a plurality of interconnects 1225, and a plurality of embedded interconnects 1223.

The substrate 1202 may be a core substrate. The substrate 1202 may also include a dielectric layer 228 that is formed over the core layer 320. The materials for the dielectric layer 228 may include dry film, such as a multi-functional filled epoxy and/or prepreg (PPG). The PPG may include glass fibers with resin. The core layer 320 may include different dielectric materials, such a silicon, glass, quartz, epoxy, or combinations thereof. The core layer is an example of a dielectric layer.

The plurality of embedded interconnects 1223 may include embedded traces and/or embedded pads. The plurality of embedded interconnects 1223 is partially embedded through a first planar surface (e.g., surface facing the die 204) of the substrate 1202. In some implementations, the plurality of embedded interconnects 1223 are embedded surface interconnects of the substrate 1202. In some implementations, a partially embedded interconnect is an interconnect that is partially located in a dielectric layer or core layer; and partially external of a dielectric layer or a core layer. In some implementations, an embedded interconnect travels and/or is located through a first planar surface of the substrate such that a first portion of the embedded interconnect is located within a dielectric layer and a second portion of the embedded interconnect is external of a dielectric layer. In some implementations, a thickness of the first portion of the embedded interconnect is in a range of about 50-100 percent (e.g., 50-99 percent) of the total thickness of the embedded interconnect, and a thickness of the second portion of the embedded interconnect is in a range of about 0-50 percent (e.g., 1-50 percent) of the total thickness of the embedded interconnect.

As shown in FIG. 12, the embedded interconnect 1223a is partially embedded in the dielectric layer 228, leaving portions of the embedded interconnect 1223a free of a dielectric layer. Thus, a first portion of the embedded interconnect 1223a is below a first planar surface of the substrate 1202 (e.g., first planar surface of the dielectric layer 228), and a second portion of the embedded interconnect 1223a is above the first planar surface of the substrate 302. The embedded interconnect 1223a may be made of a contiguous interconnect.

The die 204 is coupled to the substrate 302 through a plurality of bump interconnects 240 and a plurality of solder interconnects 242. For example, the die 204 may include bump interconnect 240a and solder interconnect 242a. The bump interconnect 240a is coupled to the solder interconnect 242a. The solder interconnect 242a is coupled to the embedded interconnect 1223a (e.g., embedded pad). The embedded interconnect 1223a is coupled to the interconnect 1225a (e.g., via). The walls of the vias are angled or nonvertical relative to the first surface and the second surface of the core layer 320.

There are several technical advantages to the configuration of FIG. 12. One, the use of embedded interconnects reduces the likelihood of filler being located between the embedded interconnects and the bump interconnects and solder interconnects. Two, the use of embedded interconnects provides finer pitch and finer spacing of interconnects that are coupled to the bump interconnects and solder interconnects of a die. This results in higher density interconnects for the substrate. In some implementations, each embedded interconnect from the plurality of embedded interconnects 1223 has a minimum width of 5 micrometers (μm), and a minimum spacing, between embedded interconnects, of 5 micrometers (μm). The above line and space (L/S) dimensions are possible because of a fabrication process that reduces peeling and interconnect lift off issues. The plurality of embedded interconnects may have a minimum pitch of about 65 micrometers (μm). Similarly, the plurality of bump interconnects 240 may have a minimum pitch of about 65 micrometers (μm).

Figure 13:
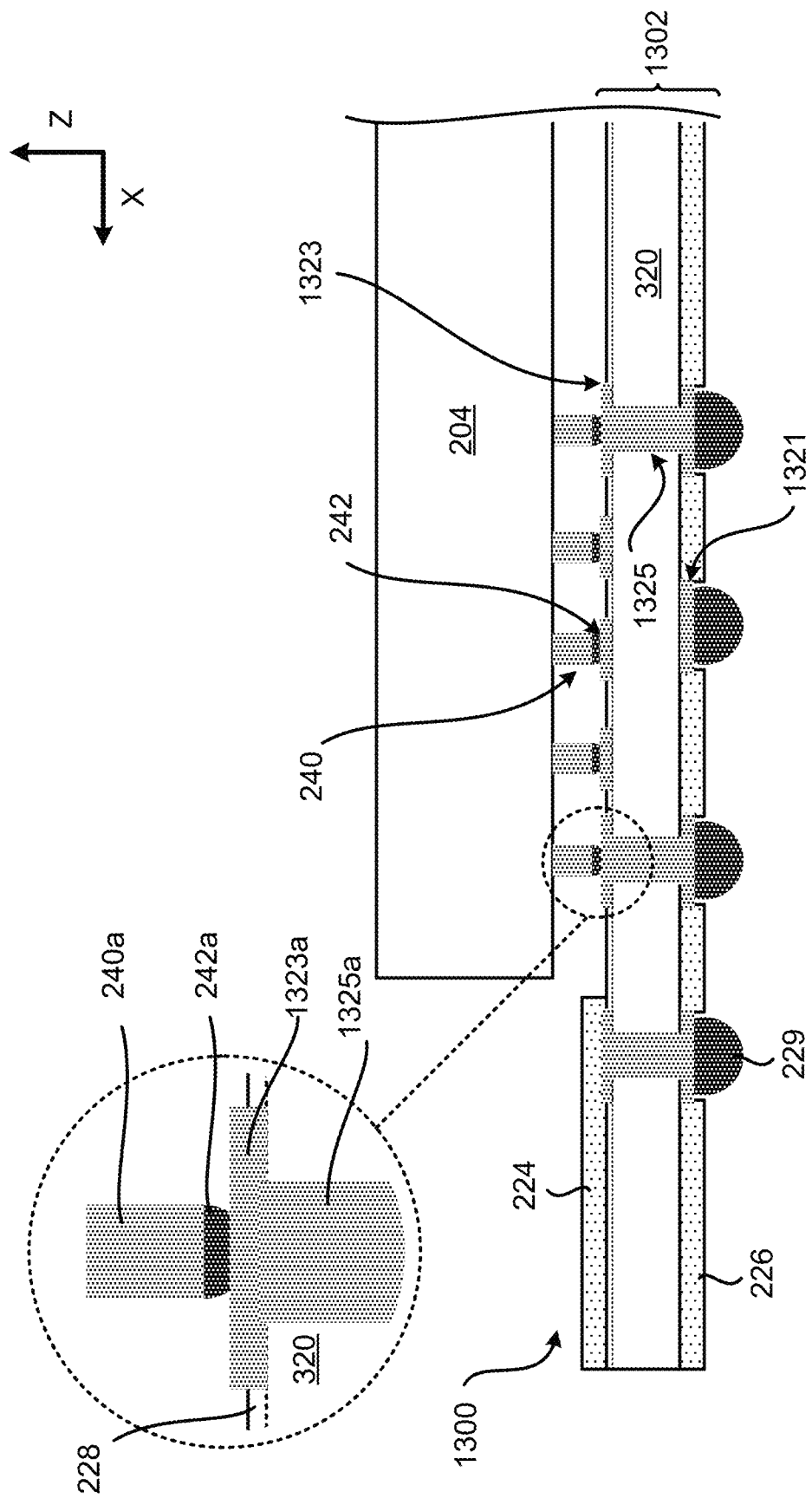
FIG. 13 illustrates a profile view of a package that includes a die and a core substrate with embedded surface interconnects.

FIG. 13 illustrates a profile view of a device 1300 that includes a substrate 1302 and the die 204. The device 1300 may be an integrated device and/or an integrated package (e.g. integrated circuit (IC) package). The substrate 1302 includes the core layer 320, the first solder resist layer 224, the second solder resist layer 226, the plurality of interconnects 1321, a plurality of interconnects 1325, and a plurality of embedded interconnects 1323. The substrate 1302 may be a core substrate. The substrate 1302 may also include a dielectric layer 228 that is formed over the core layer 320. The materials for the dielectric layer 228 may include dry film, such as a multi-functional filled epoxy and/or prepreg (PPG). The PPG may include glass fibers with resin. The core layer 320 may include different dielectric materials, such a silicon, glass, quartz, epoxy, or combinations thereof. The core layer is an example of a dielectric layer.

The substrate 1302 of FIG. 13 is similar to the substrate 1202 of FIG. 12. However, the core layer 320 includes vias (e.g., interconnect 1325a) that have walls that are approximately vertical to a first surface and/or a second surface of the core layer 320.

The plurality of embedded interconnects 1323 may include embedded traces and/or embedded pads. The plurality of embedded interconnects 1323 is partially embedded through a first planar surface (e.g., surface facing the die 204) of the substrate 1302. In some implementations, the plurality of embedded interconnects 1323 are embedded surface interconnects of the substrate 1302. In some implementations, a partially embedded interconnect is an interconnect that is partially located in a dielectric layer or core layer; and partially external of a dielectric layer or a core layer. In some implementations, an embedded interconnect travels and/or is located through a first planar surface of the substrate such that a first portion of the embedded interconnect is located within a dielectric layer and a second portion of the embedded interconnect is external of a dielectric layer. In some implementations, a thickness of the first portion of the embedded interconnect is in a range of about 50-100 percent (e.g., 50-99 percent) of the total thickness of the embedded interconnect, and a thickness of the second portion of the embedded interconnect is in a range of about 0-50 percent (e.g., 1-50 percent) of the total thickness of the embedded interconnect.

As shown in FIG. 13, the embedded interconnect 1323a is partially embedded in the dielectric layer 228, leaving portions of the embedded interconnect 1323a free of a dielectric layer. Thus, a first portion of the embedded interconnect 1323a is below a first planar surface of the substrate 1302 (e.g., first planar surface of the dielectric layer 228), and a second portion of the embedded interconnect 1323a is above the first planar surface of the substrate 1302. The embedded interconnect 1323a may be made of a contiguous interconnect.

The die 204 is coupled to the substrate 1302 through a plurality of bump interconnects 240 and a plurality of solder interconnects 242. For example, the die 204 may include bump interconnect 240a and solder interconnect 242a. The bump interconnect 240a is coupled to the solder interconnect 242a. The solder interconnect 242a is coupled to the embedded interconnect 1323a (e.g., embedded pad). The embedded interconnect 1323a is coupled to the interconnect 1325a (e.g., via). The walls of the vias are angled or nonvertical relative to the first surface and the second surface of the core layer 320.

In some implementations, the processes of FIGS. 8, 9A-9F and/or 10A-10F as described above, may be used to fabricate the device 1200 and/or the device 1300.

Exemplary Electronic Devices

Figure 14:
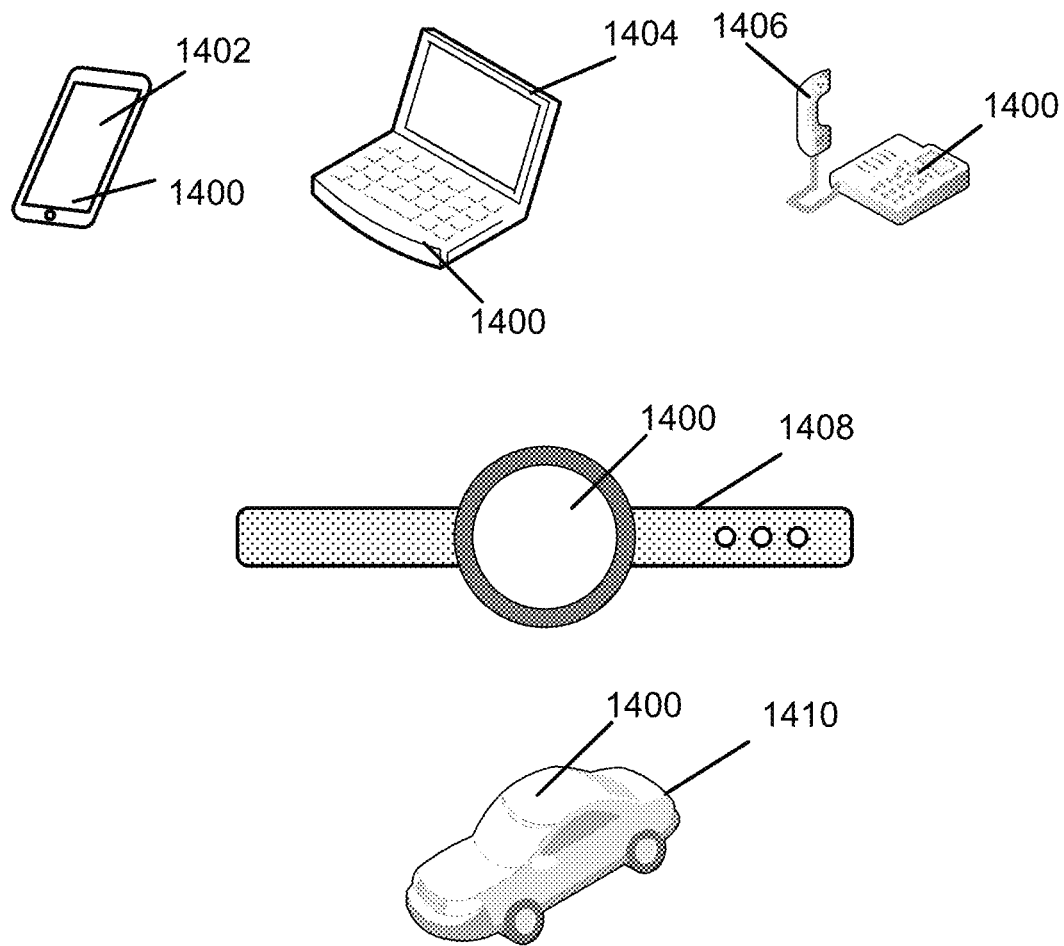
FIG. 14 illustrates various electronic devices that may integrate a die, an integrated device, an integrated passive device (IPD), a device package, a package, an integrated circuit and/or PCB described herein.

FIG. 14 illustrates various electronic devices that may be integrated with any of the aforementioned device, integrated device, integrated circuit (IC) package, integrated circuit (IC) device, semiconductor device, integrated circuit, die, interposer, package or package-on-package (PoP). For example, a mobile phone device 1402, a laptop computer device 1404, a fixed location terminal device 1406, a wearable device 1408, or automotive vehicle 1410 may include a device 1400 as described herein. The device 1400 may be, for example, any of the devices and/or integrated circuit (IC) packages described herein. The devices 1402, 1404, 1406 and 1408 and the vehicle 1410 illustrated in FIG. 14 are merely exemplary. Other electronic devices may also feature the device 1400 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 2-4, 5A-5B, 6A-6C, 7, 8, 9A-9F, 10A-10F, and/or 11-14 may be rearranged and/or combined into a single component, process, feature or function or embodied in several components, processes, or functions. Additional elements, components, processes, and/or functions may also be added without departing from the disclosure. It should also be noted FIGS. 2-4, 5A-5B, 6A-6C, 7, 8, 9A-9F, 10A-10F, and/or 11-14 and its corresponding description in the present disclosure is not limited to dies and/or ICs. In some implementations, FIGS. 2-4, 5A-5B, 6A-6C, 7, 8, 9A-9F, 10A-10F, and/or 11-14 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (PoP) device, and/or an interposer.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. The term "about 'value X'", or "approximately value X", as used in the disclosure shall mean within 10 percent of the 'value X'. For example, a value of about 1 or approximately 1, would mean a value in a range of 0.9-1.1. The term "approximately same planar cross section" may mean that the shape and size of the planar cross sections are within 1 micrometer (μm) or less (e.g., 0-1 μm) of one another. The term "same planar cross section" may mean that the shape and size of the planar cross sections are the same but for the fact that fabrication techniques may result in small variances. Thus, objects that have the same planar cross sections may be designed to be have the same planar cross sections, but due to fabrication limitations, the fabricated objects may vary slightly from object to object, but is nonetheless considered to have the same planar cross section.

In some implementations, a thickness of the first portion of the embedded interconnect (e.g., embedded surface interconnect) is in a range of about 50-100 percent (e.g., 50-99 percent) of the total thickness of the embedded interconnect. In some implementations, a thickness of the second portion of the embedded interconnect (e.g., embedded surface interconnect) is in a range of about 0-50 percent (e.g., 1-50 percent) of the total thickness of the embedded interconnect.

In some implementations, an interconnect is an element or component of a device or package that allows or facilitates an electrical connection between two points, elements and/or components. In some implementations, an interconnect may include a trace, a via, a pad, a pillar, a redistribution metal layer, and/or an under bump metallization (UBM) layer. In some implementations, an interconnect is an electrically conductive material that may be configured to provide an electrical path for a signal (e.g., a data signal, ground or power). An interconnect may be part of a circuit. An interconnect may include more than one element or component.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. A device comprising:
    a die; and
    a substrate coupled to the die, the substrate including:
        a dielectric layer; and
        a plurality of embedded interconnects, each embedded interconnect located through a first planar surface of the substrate such that a first portion of the embedded interconnect is located within the dielectric layer and a second portion of the embedded interconnect is external of the dielectric layer;
        wherein the first portion has a first planar cross section on a horizontal axis and the second portion has a second planar cross section on another horizontal axis, the first planar cross section approximately the same as the second planar cross section.

2. The device of claim 1, wherein the plurality of embedded interconnects includes embedded surface interconnects of the substrate.

3. The device of claim 1, wherein each embedded interconnect has a minimum width of approximately 5 micrometers (μm), and each embedded interconnect has a minimum spacing of approximately 5 micrometers (μm).

4. The device of claim 1, wherein the substrate includes a core layer, the dielectric layer formed over the core layer.

5. The device of claim 4, wherein the dielectric layer and the plurality of embedded interconnects are part of a build up layer of the substrate.

6. The device of claim 1, wherein the substrate includes a second dielectric layer such that the plurality of embedded interconnects is formed over the second dielectric layer.

7. The device of claim 1, wherein about 50-100 percent of a thickness of the embedded interconnect is surrounded by the dielectric layer.

8. The device of claim 1, further comprising a first solder resist layer that covers at least one embedded interconnect.

9. The device of claim 1, wherein the device is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

10. A substrate comprising:
    a dielectric layer; and
    a plurality of embedded interconnects, each embedded interconnect located through a first planar surface of the substrate such that a first portion of the embedded interconnect is located within the dielectric layer and a second portion of the embedded interconnect is external of the dielectric layer;
    wherein the first portion has a first planar cross section on a horizontal axis and the second portion has a second planar cross section on another horizontal axis, the first planar cross section approximately the same as the second planar cross section.

11. The substrate of claim 10, wherein the plurality of embedded interconnects includes embedded surface interconnects of the substrate.

12. The substrate of claim 10, wherein each embedded interconnect has a minimum width of approximately 5 micrometers (μm), and each embedded interconnect has a minimum spacing of approximately 5 micrometers (μm).

13. The substrate of claim 10, wherein the substrate includes a core layer, the dielectric layer formed over the core layer.

14. The substrate of claim 13, wherein the dielectric layer and the plurality of embedded interconnects are part of a build up layer of the substrate.

15. The substrate of claim 10, wherein the substrate includes a second dielectric layer such that the plurality of embedded interconnects is formed over the second dielectric layer.

16. The substrate of claim 10, wherein about 50-100 percent of a thickness of the embedded interconnect is surrounded by the dielectric layer.

17. The substrate of claim 10, further comprising a first solder resist layer that covers at least one embedded interconnect.

18. The substrate of claim 10, wherein the substrate is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

19. A method for fabricating a substrate, comprising:
    forming a dielectric layer; and
    forming a plurality of embedded interconnects in the dielectric layer, wherein each embedded interconnect is formed through a first planar surface of the substrate such that a first portion of the embedded interconnect is located within the dielectric layer and a second portion of the embedded interconnect is external of the dielectric layer;

wherein the first portion has a first planar cross section on a horizontal axis and the second portion has a second planar cross section on another horizontal axis, the first planar cross section approximately the same as the second planar cross section.

20. The method of claim 19, wherein the plurality of embedded interconnects includes embedded surface interconnects of the substrate.

21. The method of claim 19, wherein each embedded interconnect is formed such that (i) each embedded interconnect has a minimum width of approximately 5 micrometers (μm), and (ii) each embedded interconnect has a minimum spacing of approximately 5 micrometers (μm).

22. The method of claim 19, further comprising providing a core layer, and wherein forming the dielectric layer includes forming the dielectric layer over the core layer.

23. The method of claim 22, wherein forming the dielectric layer and forming the plurality of embedded interconnects comprises forming a build up layer of the substrate.

24. The method of claim 19, further comprising forming a second dielectric layer such that the plurality of embedded interconnects is formed over the second dielectric layer.

* * * * *